(12) United States Patent
Kami et al.

(10) Patent No.: US 12,429,787 B2
(45) Date of Patent: Sep. 30, 2025

(54) ELECTRONIC DEVICE AND METHOD FOR PRODUCING THE SAME, IMAGE FORMING METHOD, AND IMAGE FORMING APPARATUS

(71) Applicants: Hidetoshi Kami, Shizuoka (JP); Tomoharu Asano, Kanagawa (JP); Ryota Inoue, Shizuoka (JP)

(72) Inventors: Hidetoshi Kami, Shizuoka (JP); Tomoharu Asano, Kanagawa (JP); Ryota Inoue, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 632 days.

(21) Appl. No.: 17/758,801

(22) PCT Filed: Dec. 25, 2020

(86) PCT No.: PCT/JP2020/049024
§ 371 (c)(1),
(2) Date: Jul. 13, 2022

(87) PCT Pub. No.: WO2021/149461
PCT Pub. Date: Jul. 29, 2021

(65) Prior Publication Data
US 2023/0101614 A1    Mar. 30, 2023

(30) Foreign Application Priority Data
Jan. 20, 2020 (JP) .................................. 2020-006523

(51) Int. Cl.
*G03G 5/147* (2006.01)
(52) U.S. Cl.
CPC ..... *G03G 5/14704* (2013.01); *G03G 5/14773* (2013.01); *G03G 5/14795* (2013.01)

(58) Field of Classification Search
CPC .......... G03G 5/14704; G03G 5/14773; G03G 5/14795
See application file for complete search history.

(56) References Cited

U.S. PATENT DOCUMENTS

2006/0160002 A1    7/2006 Qi et al.
2007/0238039 A1*  10/2007 Coggan ............... G03G 5/0605
                                                                     430/66
(Continued)

FOREIGN PATENT DOCUMENTS

CN    104253220 A    12/2014
JP    2000-150166    5/2000
(Continued)

OTHER PUBLICATIONS

English machine translation of the description of JP-2017078842-A (Year: 2017).*
(Continued)

*Primary Examiner* — Mark F. Huff
*Assistant Examiner* — Boone Alexander Evans
(74) *Attorney, Agent, or Firm* — Grüneberg and Myers PLLC

(57) ABSTRACT

An electronic device includes a support, a charge-transporting layer, a silicone-containing layer, and a metal oxide film. The charge-transporting layer includes a charge-transporting material or a dye-sensitizing electrode layer including a sensitizing dye. The charge-transporting layer or the sensitizing-dye electrode layer is disposed on or above the support. The silicone-containing layer is disposed on or above the charge-transporting layer or the sensitizing-dye electrode layer. The metal oxide film is disposed on or above the silicone-containing layer. A ratio [Q(ACL)/Q(CTL)] is 10% or greater, where Q(ACL) is a time integral of a transient photocurrent waveform of an electronic device (ACL) measured by a time-of-flight method, and Q(CTL) is (Continued)

a time integral of a transient photocurrent waveform of an electronic device (CTL) measured by a time-of-flight method.

10 Claims, 6 Drawing Sheets

(56) References Cited

U.S. PATENT DOCUMENTS

| | | | |
|---|---|---|---|
| 2008/0176154 A1* | 7/2008 | Gyoutoku | G03G 5/144 430/59.1 |
| 2012/0100472 A1 | 4/2012 | Sonobe et al. | |
| 2013/0071780 A1 | 3/2013 | Numazawa et al. | |
| 2013/0157182 A1* | 6/2013 | Fujita | G03G 5/14704 430/57.1 |
| 2014/0120463 A1 | 5/2014 | Yamanami et al. | |
| 2014/0212705 A1 | 7/2014 | Horiuchi et al. | |
| 2016/0129432 A1 | 5/2016 | Ozaki et al. | |
| 2016/0218308 A1 | 7/2016 | Desilvestro et al. | |
| 2019/0210914 A1 | 7/2019 | Akedo et al. | |
| 2019/0243261 A1 | 8/2019 | Sakimura et al. | |
| 2020/0033743 A1 | 1/2020 | Kami et al. | |
| 2021/0003931 A1 | 1/2021 | Kubo et al. | |
| 2021/0114337 A1 | 4/2021 | Noda et al. | |
| 2022/0140284 A1 | 5/2022 | Kami et al. | |

FOREIGN PATENT DOCUMENTS

| | | |
|---|---|---|
| JP | 2001-51440 | 2/2001 |
| JP | 4118589 | 5/2008 |
| JP | 2008-201004 | 9/2008 |
| JP | 5664538 | 12/2014 |
| JP | 2015-018169 | 1/2015 |
| JP | 2016-529737 | 9/2016 |
| JP | 2017-78842 | 4/2017 |
| JP | 2017078842 A * | 4/2017 |
| JP | 6346947 | 6/2018 |
| JP | 2019-164322 | 9/2019 |
| JP | 2021-056490 | 4/2021 |
| JP | 2021-107907 | 7/2021 |
| TW | 201215587 A | 4/2012 |
| WO | WO2017/199968 A1 | 11/2017 |
| WO | WO2018/194064 A1 | 10/2018 |

OTHER PUBLICATIONS

Japanese Office Action dated Dec. 19, 2023, in Japanese Application No. 2020-006523, 2 pages.
International Search Report Issued Apr. 22, 2021 for counterpart International Patent Application No. PCT/JP2020/049024 filed Dec. 25, 2020.
Written Opinion Issued Apr. 22, 2021 for counterpart International Patent Application No. PCT/JP2020/049024 filed Dec. 25, 2020.
Mark T. Greiner et al., "Thin-film metal oxides in organic semiconductor devices: their electronic structures, work functions and interfaces", NPG Asia Materials, vol. 5, No. 7, 2013, p. e55, DOI: 10.1038/am.2013.29.
Taiwanese Office Action issued Dec. 2, 2021 (mailed Dec. 6, 2021) for corresponding Taiwanese Application No. 109146706.
Taiwanese Office Rejection Decision issued Apr. 18, 2022 (mailed Apr. 20, 2022) for corresponding Taiwanese Application No. 109146706.

* cited by examiner

[Fig. 1]
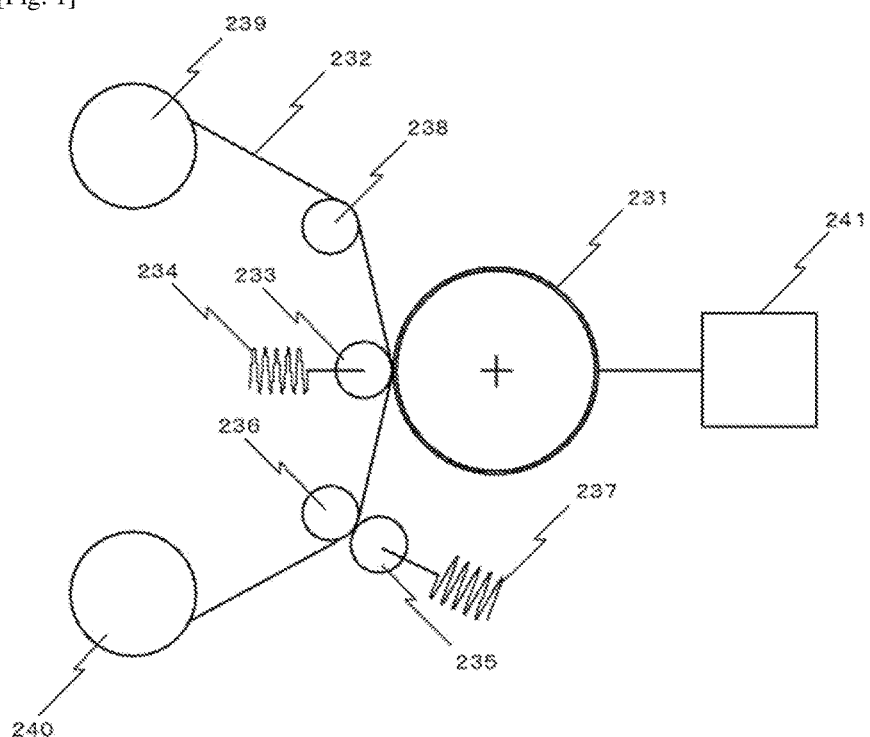
[Fig. 2A]
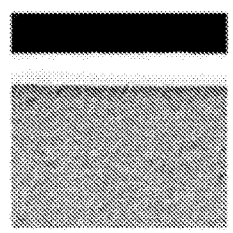
[Fig. 2B]
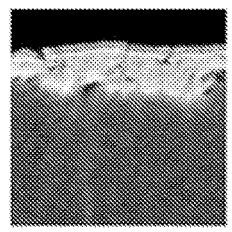
[Fig. 2C]
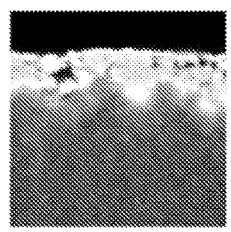

[Fig. 3]
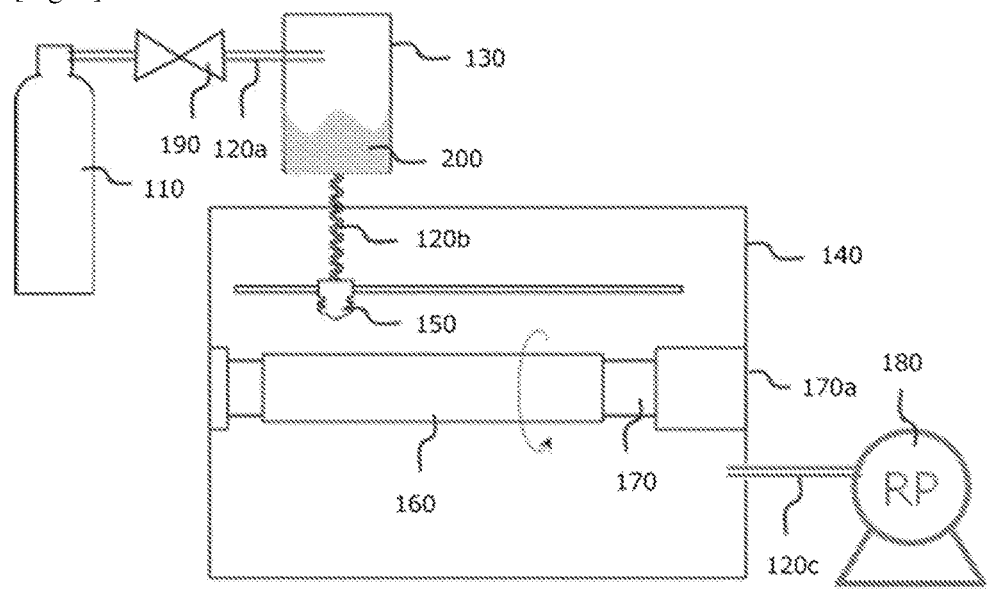
[Fig. 4]
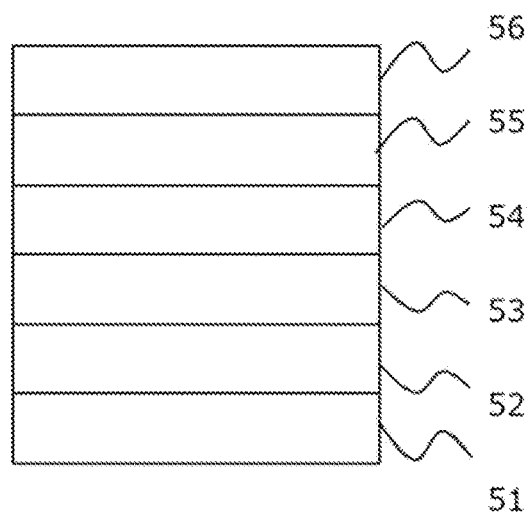
[Fig. 5]
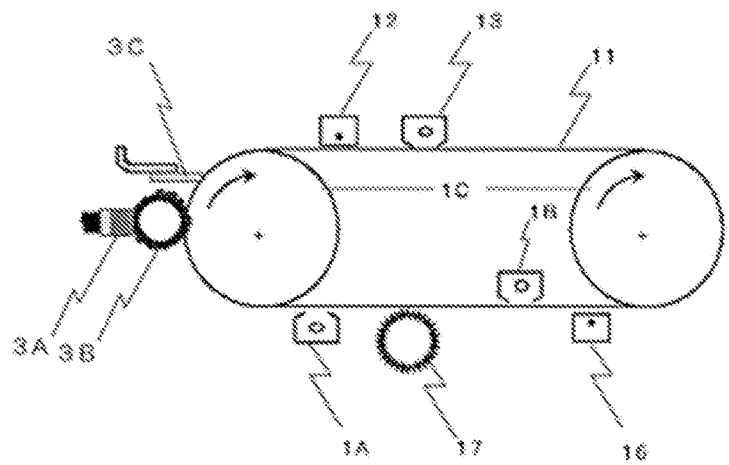

[Fig. 6]
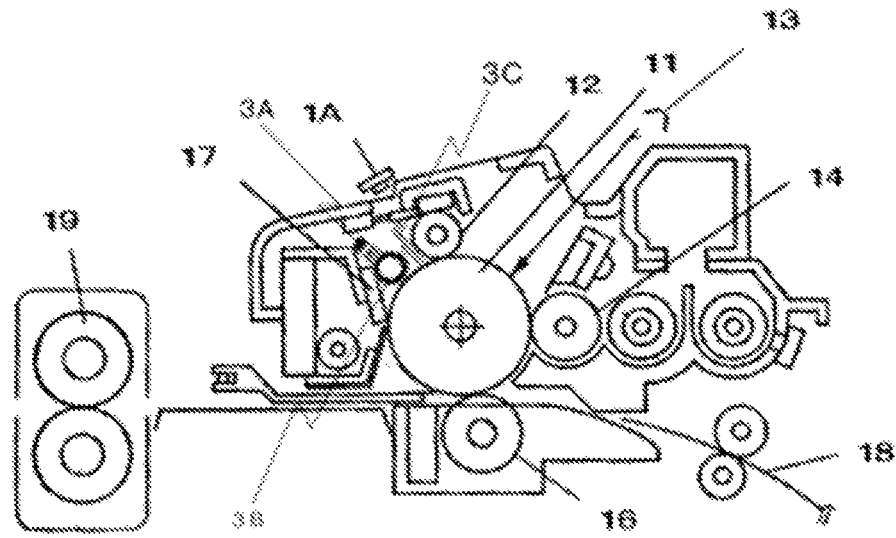
[Fig. 7]
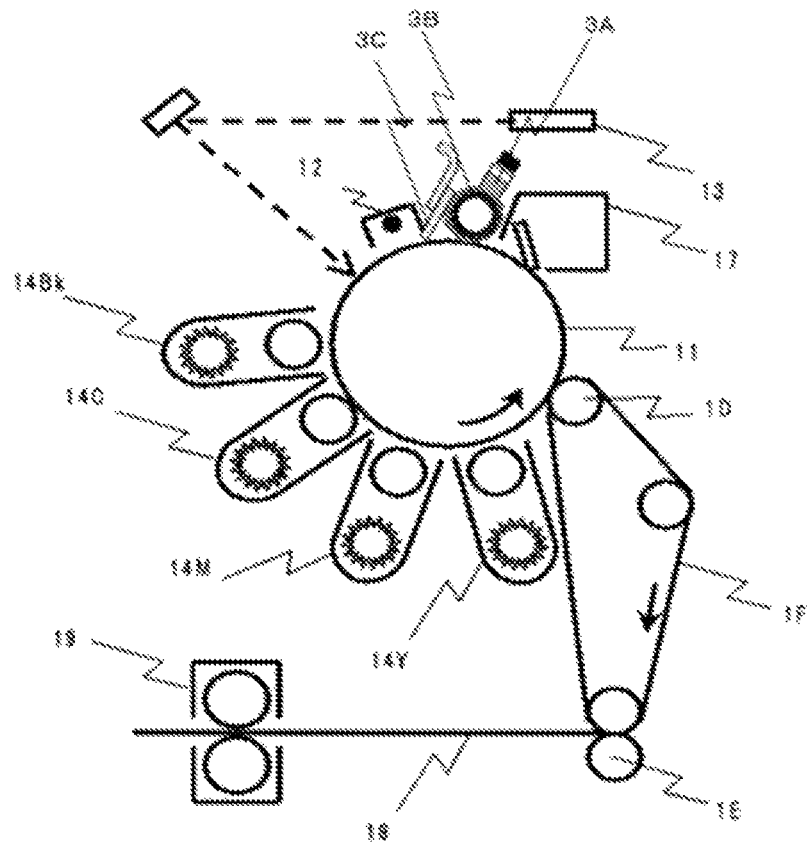

[Fig. 8]
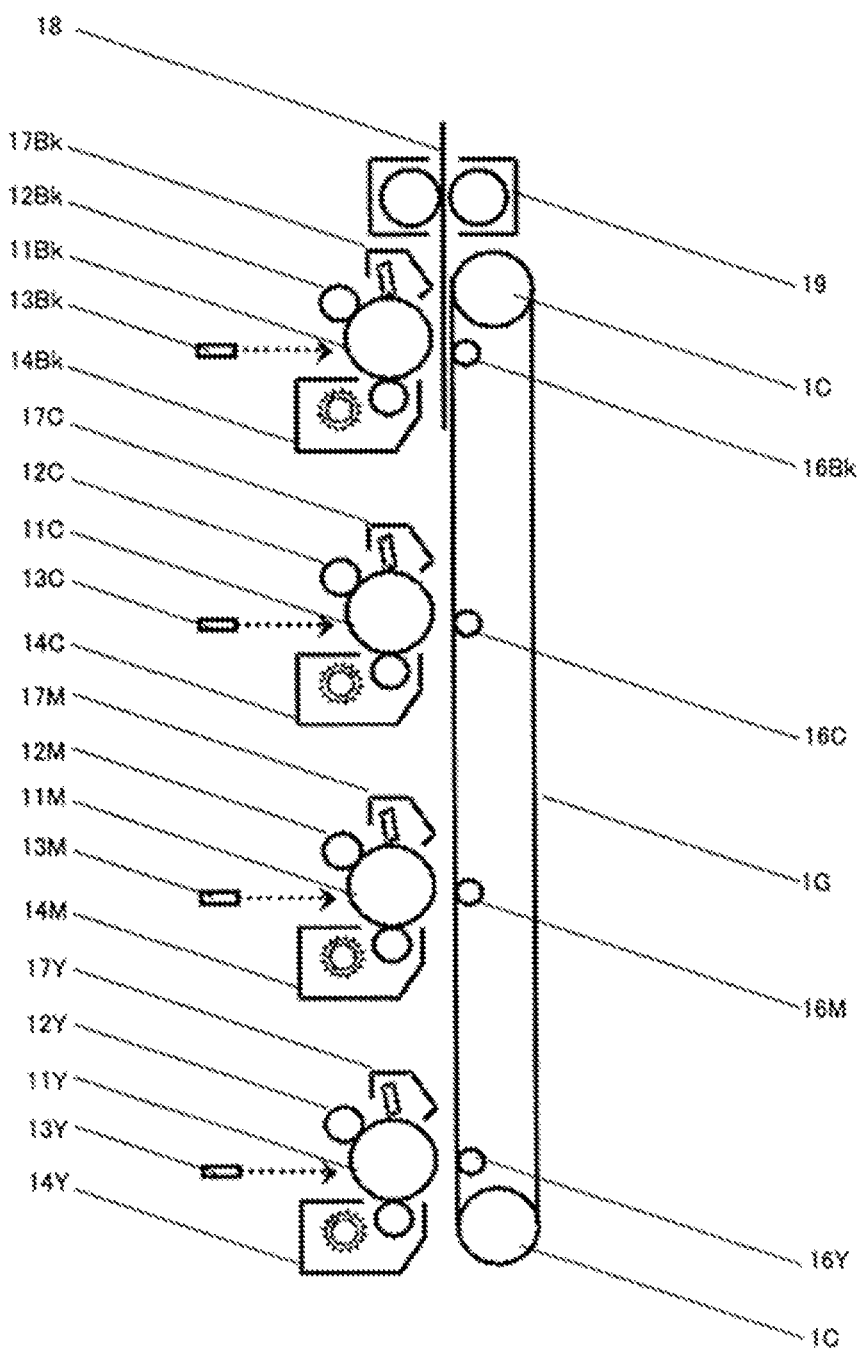

[Fig. 9]
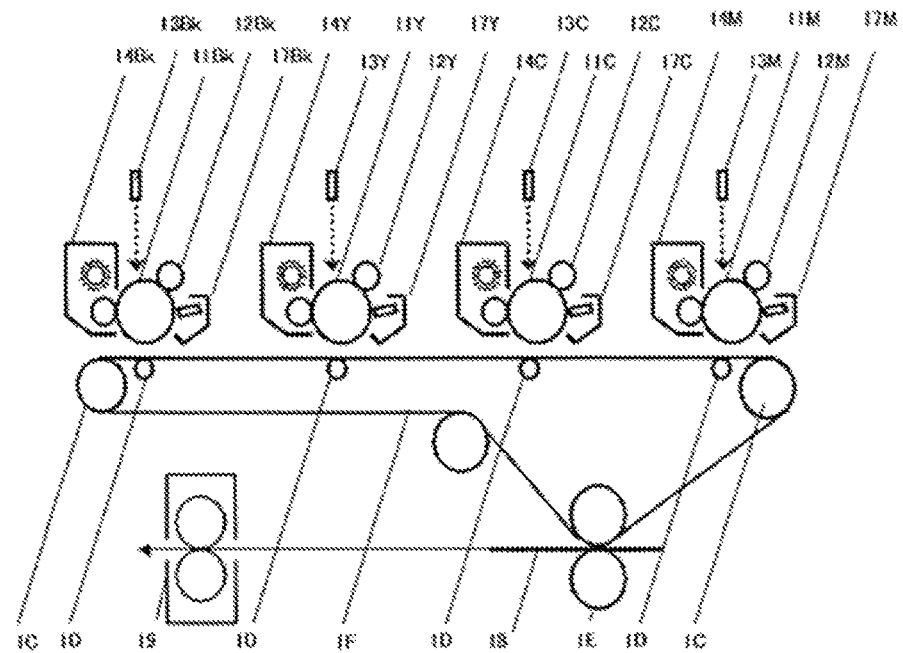
[Fig. 10]
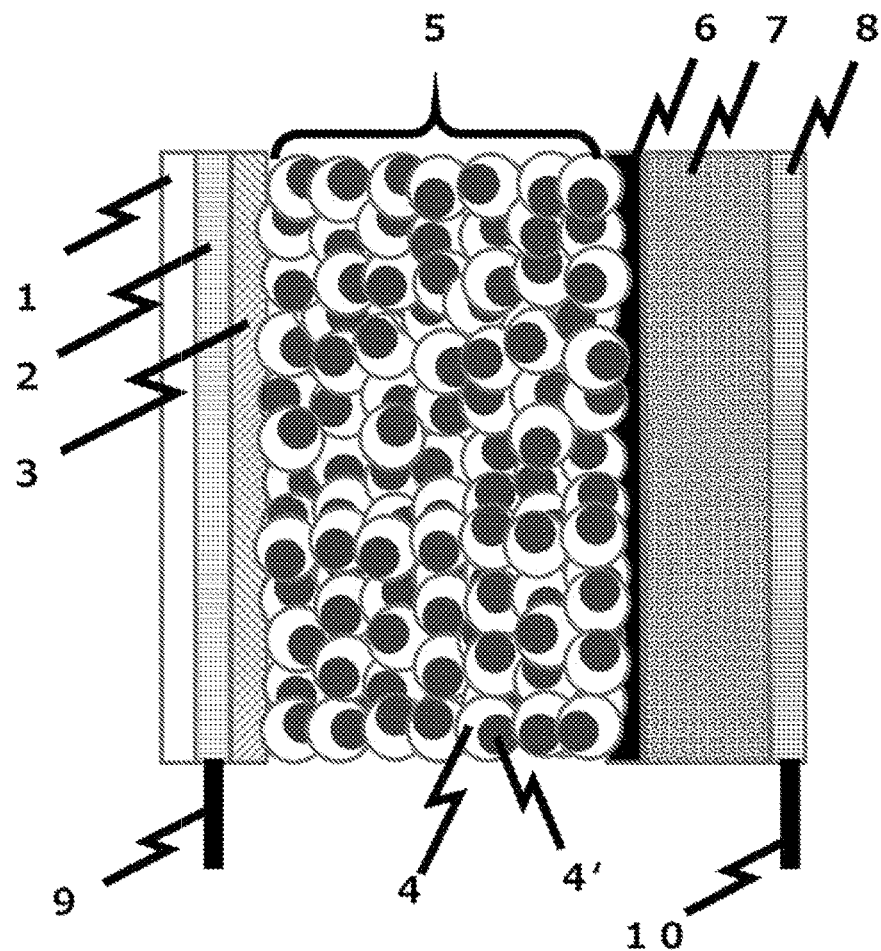

[Fig. 11]
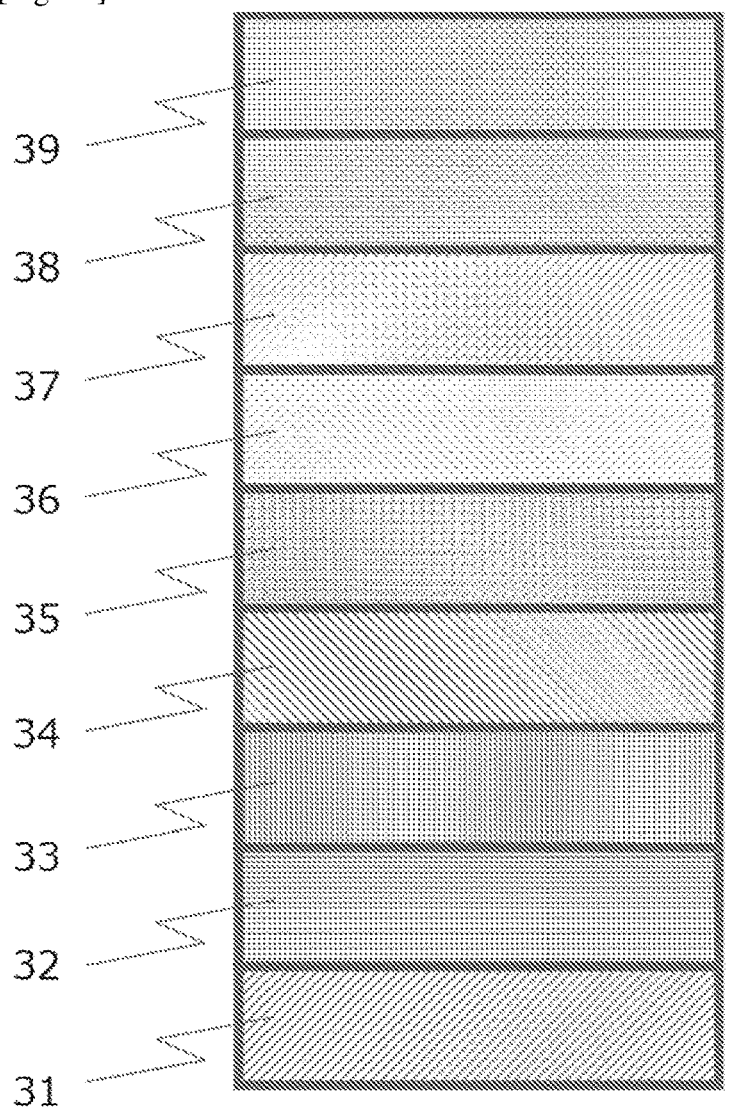
[Fig. 12]
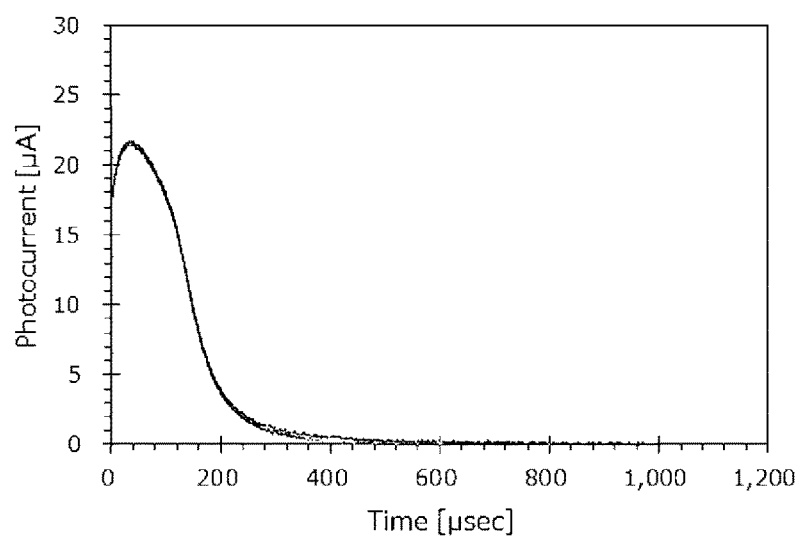

ized solar cell, and an organic EL element. However, such improvements involve the large number of processes to be performed, which may adversely affect an organic electronic device. Therefore, there is a need for a further improvement to achieve a desirable balance between cost and durability.

ELECTRONIC DEVICE AND METHOD FOR PRODUCING THE SAME, IMAGE FORMING METHOD, AND IMAGE FORMING APPARATUS

CROSS-REFERENCE TO RELATED APPLICATIONS

This application is the National Stage entry under § 371 of International Application No. PCT/JP2020/049024, filed on Dec. 25, 2020, and which claims the benefit of priority to Japanese Application No. 2020-006523, filed on Jan. 20, 2020. The content of each of these applications is hereby incorporated by reference in its entirety.

TECHNICAL FIELD

The present disclosure relates to an electronic device and a method for producing the electronic device, an image forming method, and an image forming apparatus.

BACKGROUND ART

In recent years, photoelectric conversion devices, which use therein organic semiconductors, have been developed and made available on the market.

Currently, widely available photoelectric conversion devices, such as electrophotographic photoconductors, are mostly organic electronic devices formed of organic materials. However, an organic electronic device has a problem of a shorter service life compared with an inorganic electronic device. One of the reasons why the organic electronic device has the short service life is poor gas barrier properties owing to an organic material included in the organic electronic device. In comparison with a dense film of an inorganic material, a resin film of an organic material is porous. Therefore, a food wrapping material, such as polypropylene (PP), is laminated with aluminium to enhance weather resistance of contents to be wrapped.

As an inexpensive organic solar cell compared with a silicon-based solar cell, a dye-sensitized solar cell including an organic sensitizing dye has been developed. Since the dye-sensitized solar cell includes an organic sensitizing dye that is an organic material, however, the materials for use tend to be deteriorated by a temperature, humidity, and gas (e.g., oxygen, ozone, NOx, ammonia) compared with a silicon-based solar cell, and therefore functions of the dye-sensitized solar cell tend to de degraded. Therefore, the dye-sensitized solar cell has a problem of poor durability compared with a silicon-based solar cell.

In a display element, such as an organic electroluminescent (EL) element, a light-emitting diode display element, a liquid crystal display element, and an electrophoretic ink display element, a display element, such as an organic EL layer sandwiched between a positive electrode and a negative electrode, is disposed on a substrate. Compared with a liquid crystal display device, an organic EL display device has a wide angle of view and high response speed, and therefore is expected to be a display device of the next generation because of diversity of luminescence organic materials have.

As a formation method of organic EL elements, a formation method using coating is used in view of productivity and cost. Moreover, organic EL elements tend to deteriorate as a result of exposure to heat or gas, such as moisture and oxygen. As a result, there is a problem that organic EL elements have a short service life.

There are various improvements made to enhance gas barrier properties to extend a service life of an organic electronic device, such as an electrophotographic photoconductor for a printer, a dye-sensitized solar cell, and an organic EL element. However, such improvements involve the large number of processes to be performed, which may adversely affect an organic electronic device. Therefore, there is a need for a further improvement to achieve a desirable balance between cost and durability.

As an electrophotographic photoconductor having excellent abrasion resistance and stability of image properties, for example, proposed is an electrophotographic photoconductor including a protective layer that includes a p-type semiconductor particles treated with a surface treating agent (see, for example, PTL 1). As an organic EL element, which has a long service life, improved efficiency, and low driving voltage, for example, proposed is an organic EL element, in which an organic hole-transporting layer of the organic EL element is replaced with an inorganic p-type semiconductor (see, for example, PTL 2).

Moreover, proposed is a laminate, in which a film of a particulate material of 100 micrometers or smaller, such as a ceramic material and a metal material, is formed on a substrate by aerosol deposition to form a polycrystalline brittle material layer (see, for example, PTL 3).

Abrasion resistance and gas-barrier properties can be enhanced by arranging p-type semiconductor metal oxide as a surface layer of an electronic device. Proposed is to define viscoelasticity of a coating surface of a ceramic coating applied on an organic material (see, for example, PTL 4). However, simple application of ceramic coating onto a plastic base is not sufficient to impart precise semiconductor characteristics.

CITATION LIST

Patent Literature

PTL 1: Japanese Patent No. 5664538
PTL 2: Japanese Unexamined Patent Application Publication No. 2000-150166
PTL 3: Japanese Unexamined Patent Application Publication No. 2008-201004
PTL 4: International Patent Publication No. WO2018/194064

SUMMARY OF INVENTION

Technical Problem

The present disclosure has an object to provide an electronic device that has a metal oxide film at a surface thereof, and realizes precise photoelectric conversion.

Solution to Problem

According to one aspect of the present disclosure, an electronic device includes a support, a charge-transporting layer including a charge-transporting material or a dye-sensitizing electrode layer including a sensitizing dye, where the charge-transporting layer or the sensitizing-dye electrode layer is disposed on or above the support, a silicone-containing layer disposed on the charge-transporting layer or the sensitizing-dye electrode layer, and a metal oxide film disposed on or above the silicone-containing layer. A ratio [Q(ACL)/Q(CTL)] is 10% or greater, where Q(ACL) is a time integral of a transient photocurrent waveform of an electronic device (ACL) measured by a time-of-flight method, and Q(CTL) is a time integral of a transient photocurrent waveform of an electronic device (CTL) measured by a time-of-flight method. The electronic device (ACL) has the silicone-containing layer as an outermost layer, and is obtained by removing the metal oxide film from the electronic device. The electronic device (CTL) has the charge-transporting layer or the sensitizing-dye electrode layer as an outermost layer, and is obtained by removing the metal oxide film and the silicone-containing layer from the electronic device.

Advantageous Effects of Invention

The present disclosure can provide an electronic device that has a metal oxide film at a surface thereof, and realizes precise photoelectric conversion.

BRIEF DESCRIPTION OF DRAWINGS

FIG. 1 is a structural view illustrating a device for removing a surface layer of an electronic device.

FIG. 2A is a photograph illustrating one example of ceramic in the form of a film.

FIG. 2B is a photograph illustrating one example of ceramic in the form of a film.

FIG. 2C is a photograph illustrating one example of ceramic in the form of a film.

FIG. 3 is a schematic structural view illustrating one example of an aerosol deposition device used when the metal oxide film of the present disclosure is formed.

FIG. 4 is a cross-sectional view illustrating one example of the electronic device (electrophotographic photoconductor) of the present disclosure.

FIG. 5 is a schematic structural view illustrating one example of the image forming apparatus of the present disclosure.

FIG. 6 is a schematic structural view illustrating another example of the image forming apparatus of the present disclosure.

FIG. 7 is a schematic structural view illustrating another example of the image forming apparatus of the present disclosure.

FIG. 8 is a schematic structural view illustrating another example of the image forming apparatus of the present disclosure.

FIG. 9 is a schematic structural view illustrating another example of the image forming apparatus of the present disclosure.

FIG. 10 is a cross-sectional view illustrating one example of the electronic device (solar cell) of the present disclosure.

FIG. 11 is a cross-sectional view illustrating one example of the electronic device (organic EL element) of the present disclosure.

FIG. 12 is a graph depicting an example of a mobility measurement.

DESCRIPTION OF EMBODIMENTS (Electronic Device)

The electronic device of the present disclosure includes a support, a charge-transporting layer or a sensitizing-dye electrode layer, a silicone-containing layer, and a metal oxide film. The electronic device may further include other members according to the necessity.

A ratio [Q(ACL)/Q(CTL)] is 10% or greater, where Q(ACL) is a time integral of a transient photocurrent waveform of an electronic device (ACL) measured by a time-of-flight method, and Q(CTL) is a time integral of a transient photocurrent waveform of an electronic device (CTL) measured by a time-of-flight method.

The electronic device (ACL) has the silicone-containing layer as an outermost layer, and is obtained by removing the metal oxide film from the electronic device of the present disclosure.

The electronic device (CTL) has the charge-transporting layer or the sensitizing-dye electrode layer as an outermost layer, and is obtained by removing the metal oxide film and the silicone-containing layer from the electronic device of the present disclosure.

<Ratio [Q(ACL)/Q(CTL)]>

The ratio [Q(ACL)/Q(CTL)] is 10% or greater. Since the ratio [Q(ACL)/Q(CTL)] is 10% or greater, precise photoelectric conversion can be realized. When the ratio [Q(ACL)/Q(CTL)] is less than 10%, precise photoelectric conversion cannot be realized.

In order to achieve precise photoelectric conversion (precise developing of a halftone image), the ratio [Q(ACL)/Q(CTL)] is preferably 12% or greater, and more preferably 15% or greater. The larger value of the ratio [Q(ACL)/Q(CTL)] is more preferable. The upper limit thereof is not particularly limited and may be appropriately selected depending on the intended purpose. Although the larger value of the ratio [Q(ACL)/Q(CTL)] is preferable, the effect thereof tends to be leveled out as the value increases. Therefore, the upper limit thereof may be, for example, 30% or less, 25% or less, or 20% or less.

For example, the electronic device (ACL), which has the silicone-containing layer as an outermost layer and is obtained by removing the metal oxide film from the electronic device, and the electronic device (CTL), which has the charge-transporting layer or the sensitizing-dye electrode layer as an outermost layer and is obtained by removing the metal oxide film and the silicone-containing layer from the electronic device, can be produced in the following manner.

The metal oxide film alone, or the metal oxide film and the silicone-containing layer are removed by the device illustrated in FIG. 1.

FIG. 1 illustrates a device for removing a surface layer of an electronic device. The device of FIG. 1 is a photoconductor reproduction device, but the device can be also used for removing the surface layer.

In FIG. 1, a cylindrical photoconductor is explained as an example, but the embodiment of the photoconductor is not limited to the cylindrical photoconductor. The photoconductor 231 is attached to a driving motor (not illustrated), and the photoconductor 231 is rotated in the clockwise direction at the predetermined speed. The rotational speed of the photoconductor 231 is controlled by a programmable logic controller (PLC). The rotational speed of the photoconductor is adjusted depending on the size of the outer diameter of the photoconductor. The rotational speed is set at 50 rpm or faster but 500 rpm or slower. In order to prevent runout of rotations of the photoconductor, a shaft may be inserted into the center of the photoconductor to rotate, or a flywheel may be mounted to rotate the photoconductor.

A wrapping film 232 wound around a feeding roller 239 in the form of a roll is mounted, and the end of the film is attached to a winding roller 240 with passing through feed rollers 238 and 236, and a press roller 233. A braking unit may be disposed to the feeding roller 239 to prevent backward feeding of the film. Moreover, the film may be nipped between the feed roller 236 and a pinch roller 235 equipped with a load member 237 in order to prevent the film from being wobbled at the time of feeding. As the load member, a part capable of applying load, such as a spring and a roller, is used. Similarly to the photoconductor, the winding roller is rotated by a driving motor to roll up the wrapping film.

The press roller 233 is pressed against the photoconductor 231 over the wrapping film 232 by adjusting the load member 234.

A surface of the photoconductor is polished as a result of frictions caused between the wrapping film 232 and the photoconductor 231 by pressure applied with the press roller 233. When the load applied to the contact surface of the wrapping film and the contact surface of the photoconductor is significantly uneven, therefore, the photoconductor is unevenly worn. In order to evenly polish the surface of the photoconductor regardless of the polishing position, a press roller having JIS-A hardness (JIS K6301A) of 40° or greater but 80° or less, and outer diameter runout tolerance of 30 micrometers or less is preferably used.

Jamming of the wrapping film 232 may be caused to a certain extent by the abrasion powder generated from the polishing of the photoconductor surface. Therefore, a polishing defect may be prevented by feeding the wrapping film at the speed of about 1 m/hr or faster but about 3 m/hr or slower.

Once the metal oxide film is removed using the device of FIG. 1, the silicone-containing layer is exposed. A quantity of electric charge Q(ACL) is calculated from a measurement of a transient photocurrent waveform of the electronic device where the silicone-containing layer is exposed at the surface. A sum of the photocurrent values obtained by a time-of-flight measuring device (TOF-401), each multiplied by a sampling time, is determined as a quantity of electric charge Q(ACL). In the present disclosure, a photocurrent value is sampled per 0.1 microseconds.

Next, the silicone-containing layer is similarly removed by means of the device of FIG. 1. A quantity of electric charge Q(CTL) is calculated by a measurement of a transient photocurrent waveform of the electronic device of this state in the same manner as described above.

A ratio of the quantity of electric charge is determined from the quantity of electric charge Q(ACL) and the quantity of electric charge Q(CTL) according to the following equation.

[Math. 1]

$$\text{Ratio of electric charge quantity} = \frac{Q(ACL)}{Q(CTL)} \quad \text{Equation (1)}$$

The quantity of electric charge Q(ACL) is a time integral Q(ACL) of a transient photocurrent waveform of the electronic device (ACL) measured by a time-of-flight method.

The quantity of electric charge Q(CTL) is a time integral Q(CTL) of a transient photocurrent waveform of the electronic device (CTL) measured by a time-of-flight method.

For example, the time integral is an area defined by the waveform and the horizontal axis of the graph in FIG. 12.

FIG. 12 is a graph depicting the result obtained by applying bias of +500 V to an aluminium support of a photoconductor drum, irradiating the photoconductor drum with pulsed later light of 782 nm from the side of an electrode sticker, and displaying a state of transporting charge carriers photoexcited in a charge-generating layer of the photoconductor as a waveform of a photocurrent transient relative to time with an oscilloscope. The time-of-flight measuring device (TOF-401) used in the measurement of the present disclosure can continuously display transient photocurrent waveforms of the set number of measurements on an oscilloscope within the device. It can be confirmed from observation of the waveforms that the waveforms are matched with one another and there is no variation in the waveforms. Moreover, an average of the waveform data from all of the measurements is recorded as a measurement result. Since the peak curve of the waveform can be made sharp, thereof, it is possible to calculate the quantity of electric charge that can be reproducible. FIG. 12 depicts a waveform that is an average of 32 transient photocurrent waveforms obtained by 32 measurements.

In the present disclosure, several measurements of Q(ACL) and Q(CTL) may be performed at several points, but Q(ACL) and Q(CTL) may be each measured at a predetermined one point. In Examples of the present disclosure described later, a measurement is performed at one position on a center of a measurement target.

The electronic device is not particularly limited and may be appropriately selected depending on the intended purpose. Examples of the electronic device include devices, such as an electrophotographic photoconductor, a solar cell, an organic electroluminescent (EL) element, a transistor, an integrated circuit, a laser diode, and a light emitting diode.

<Silicone-Containing Layer>

The silicone-containing layer is not particularly limited and may be appropriately selected depending on the intended purpose, as long as the silicone-containing layer has a polysiloxane structure.

Since the silicone-containing layer has a polysiloxane structure, the silicone-containing layer, which is a easily and inexpensively formed laminate structure including a film of an organic material and a film of metal oxide, can suppress erosion of an underlying layer when the film of the metal oxide is formed, or separation of the film of the metal oxide can be prevented.

For example, the silicone-containing layer is formed by crosslinking an organic silicon compound having a hydroxyl group or a hydrolysable group. The silicone-containing layer may further include a catalyst, a crosslinking agent, organosilica sol, a silane coupling agent, or a polymer, such as an acryl polymer, according to the necessity.

The crosslinking is not particularly limited and may be appropriately selected depending on the intended purpose. The crosslinking is preferably thermal crosslinking.

Examples of the organic silicon compound having a hydroxyl group or a hydrolysable group include a compound having an alkoxysilyl group, a partial hydrolysis condensate of the compound having an alkoxysilyl group, and a mixture thereof.

Examples of the compound having an alkoxysilyl group include: tetraalkoxysilane, such as tetraethoxysilane; alkyltrialkoxysilane, such as methyltriethoxysilane; and aryltrialkoxysilane, such as phenyltriethoxysilane.

Note that, an epoxy group, a methacryloyl group, or a vinyl group may be introduced into any of the above-listed compounds.

The partial hydrolysis condensate of the compound having an alkoxysilyl group can be produced by any of methods known in the art, such as by adding predetermined amounts of water, a catalyst, etc. to the compound having an alkoxysilyl group to allow the mixture to react.

As raw materials of the silicone-containing layer, a commercial product can be used. Specific examples thereof include GR-COAT (available from Daicel Corporation), Glass Resin (available from OWENS CORNING JAPAN LLC.), heat-less glass (available from OHASHI CHEMI- CAL INDUSTRIES LTD.), NSC (available from NIPPON FINE CHEMICAL CO., LTD.), glass raw fluid GO150SX and GO200CL (available from Fine Glass Technologies Co., Ltd.), and as copolymers between an alkoxysilyl compound and an acrylic resin or a polyester resin, MKC silicate (available from Mitsubishi Chemical Corporation), silicate/acryl varnish XP-1030-1 (available from Dainippon Shikizai Kogyo Co., Ltd.), and NSC-5506 (available from NIPPON FINE CHEMICAL CO., LTD.).

<<Monoalkoxysilane>>

The silicone-containing layer preferably includes monoalkoxysilane as a constitutional component.

Since the predetermined amount of the monoalkoxysilane is included in the constitutional components of the silicone-containing layer, formation of cracks of the silicone-containing layer can be prevented. Moreover, properties of the electronic device are stable against temperature fluctuations.

Examples of the monoalkoxysilane include monoalkoxyalkylsilane, such as trimethylethoxysilane, trimethylmethoxysilane, tripropylethoxysilane, and trihexylethoxysilane. For example, the number of carbon atoms of the alkoxy group is 1 or greater but 3 or less. For example, the number of carbon atoms of the alkyl group is 1 or greater but 6 or less. Trimethylethoxysilane is particularly effective.

An amount of the monoalkoxysilane in the constitutional components of the silicone-containing layer is preferably 5% by mass or greater but 50% by mass or less, and more preferably 10% by mass or greater but 30% by mass or less.

The silicone-containing layer preferably includes at least one selected from the group consisting of a triphenylamine compound having a hydroxyl group, polymethylphenylsilane, and delafossite oxide, as a constitutional component, because the ratio [Q(ACL)/Q(CTL)] can be easily adjusted to 10% or greater.

The above-listed component may be present as a reaction product obtained by reacting with another component constituting the silicone-containing layer, or may be present as it is without any reaction.

A combined amount of the triphenylamine compound and the delafossite oxide in the constitutional components of the silicone-containing layer is not particularly limited and may be appropriately selected depending on the intended purpose. The combined amount is preferably 10% by mass or greater but 40% by mass or less relative to a total amount of all of the constitutional components of the silicone-containing layer, because the ratio [Q(ACL)/Q(CTL)] can be easily adjusted to 10% or greater, desirable adhesion is imparted on both sides of the silicone-containing layer, cracks of the silicone-containing layer is prevented, and extreme erosion is prevented when a metal oxide film is formed.

<<Triphenylamine Compound Including Hydroxyl Group>>

The triphenylamine compound having a hydroxyl group is not particularly limited and may be appropriately selected depending on the intended purpose, as long as the triphenylamine compound is a compound including a hydroxyl group, a nitrogen atom, and 3 aromatic groups bonded to the nitrogen atom.

As the triphenylamine compound having a hydroxyl group, the following compounds represented by General Formula (1), General Formula (2), Structural Formula (3), and General Formula (4) are particularly effective because such compounds often have excellent reactivity with a thermoset resin monomer, and have excellent sensitivity.

[Chem.1]

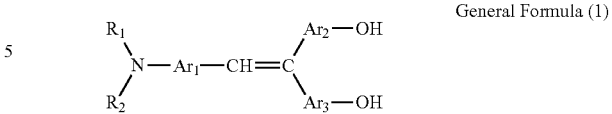

General Formula (1)

$R_1$ and $R_2$ are each a substituted or unsubstituted aryl group. $R_1$ and $R_2$ may be the same or different.

$Ar_1$, $Ar_2$ and $Ar_3$ are each an arylene group. Examples of the arylene group include the divalent groups of the aryl group identical to those listed as $R_1$ and $R_2$. $Ar_1$, $Ar_2$ and $Ar_3$ may be the same or different.

Specific examples of $R_1$ and $R_2$, which are substituted or unsubstituted aryl groups, include the following groups. $R_1$ and $R_2$ may be the same or different.

Listed as an aromatic hydrocarbon group are a phenyl group, a condensed polycyclic group (e.g., a naphthyl group, a pyrenyl group, a 2-fluorenyl group, a 9,9-dimethyl-2-fluorenyl group, an azulenyl group, an anthryl group, a triphenylenyl group, a chrysenyl group, a fluorenylidenephenyl group, and a 5H-dibenzo[a,d]cycloheptenylidenephenyl group), and a non-condensed polycyclic group (e.g., a biphenyl group, a terphenyl group, and the following group:

[Chem.2]

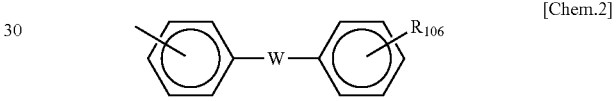

(with the proviso that W is —O—, —S—, —SO—, —SO$_2$—, —CO— or any of the following divalent groups, and $R_{106}$ will be described later)

[Chem.3]

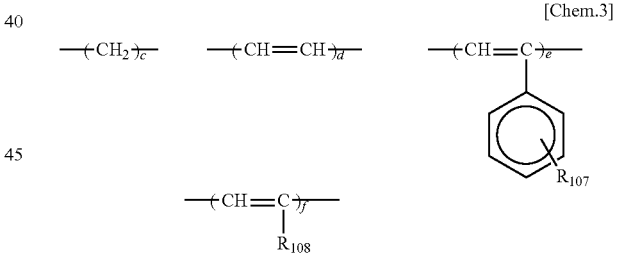

(with the proviso that c is an integer of from 1 through 12, d is an integer of from 1 through 3, e is an integer of from 1 through 3, f is an integer of from 1 through 3, and $R_{107}$ and $R_{108}$ will be described later).

Listed as a heterocycle group are a thienyl group, a benzothienyl group, a furyl group, a benzofuranyl group, and a carbozolyl group.

The above-mentioned aryl group and arylene group may include the following groups as a substituent.

Moreover, the following substituents are also specific examples of $R_{106}$, $R_{107}$, and $R_{108}$ of the general formulae above.

(1) A halogen atom, a trifluoromethyl group, a cyano group, and a nitro group.

(2) An alkyl group, which is preferably a $C_1$ to $C_{12}$, particularly preferably $C_1$ to $C_{18}$, and more preferably $C_1$ to $C_4$ straight-chain or branched-chain alkyl group, and may further include a fluorine atom, a hydroxyl group, a cyano group, a $C_1$ to $C_4$ alkoxy group, a phenyl group, or a phenyl group substituted with a halogen atom, a $C_1$ to $C_4$ alkyl group, or a $C_1$ to $C_4$ alkoxy group. Specific examples thereof include a methyl group, an ethyl group, a n-propyl group, an i-propyl group, a t-butyl group, a s-butyl group, a n-butyl group, an i-butyl group, a trifluoromethyl group, a 2-hydroxyethyl group, a 2-cyanoethyl group, a 2-ethoxyethyl group, a 2-methoxyethyl group, a benzyl group, a 4-chlorobenzyl group, a 4-methylbenzyl group, a 4-methoxybenzyl group, and a 4-phenylbenzyl group.

(3) Specifically listed as an alkoxy group are a methoxy group, an ethoxy group, a n-propoxy group, an i-propoxy group, a t-butoxy group, a n-butoxy group, a s-butoxy group, an i-butoxy group, a 2-hydroxyethoxy group, a 2-cyanoethoxy group, a benzyloxy group, a 4-methylbenzyloxy group, and a trifluoromethoxy group.

(4) Listed as an aryloxy group are an aryl group, such as a phenyl group and a naphthyl group, which may include, as a substituent, a $C_1$ to $C_4$ alkoxy group, a $C_1$ to $C_4$ alkyl group, or a halogen atom. Specific examples thereof include a phenoxy group, a 1-naphthyloxy group, a 2-naphthyloxy group, a 4-methylphenoxy group, a 4-methoxyphenoxy group, a 4-chlorophenoxy group, and a 6-methyl-2-naphthyloxy group.

(5) Specifically listed as a substituted mercapto group or aryl mercapto group are a methylthio group, an ethylthio group, a phenylthio group, and a p-methylphenylthio group.

(6) A group represented by the following general formula:

[Chem.4]

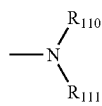

In the formula above, $R_{110}$ and $R_{111}$ are each independently an alkyl group or an aryl group. Examples of the aryl group include a phenyl group, a biphenyl group, and a naphthyl group, all of which may include, as a substituent, a $C_1$ to $C_4$ alkoxy group, a $C_1$ to $C_4$ alkyl group, or a halogen atom. Alternatively, a ring may be formed together with a carbon atom on the aryl group. Specific examples thereof include a diethylamino group, a N-methyl-N-phenylamino group, a N,N-diphenylamino group, a N,N-di(p-tolyl)amino group, a dibenzylamino group, a piperidino group, a morpholino group, and a julolidyl group.

(7) Listed are an alkylene dioxy group, such as a methylene dioxy group, and an alkylene dithio group, such as a methylene dithio group.

The compound represented by General Formula (1) is easily dissolved in a solvent such as alcohols and cellosolves. When film formation is performed using such a solvent, a clear and uniform film is easily formed.

[Chem.5]

General Formula (2)

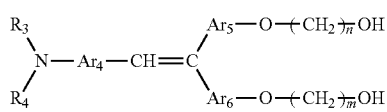

$R_3$ and $R_4$ are each a substituted or unsubstituted aryl group. $R_3$ and $R_4$ may be the same or different.

Moreover, $Ar_4$, $Ar_5$, and $Ar_6$ are each an arylene group. Examples of the arylene group include the same divalent groups of the aryl group of $R_3$ and $R_4$. $Ar_4$, $Ar_5$, and $Ar_6$ may be the same or different. Moreover, m and n are each a repeating number of from 1 through 10.

$R_3$ and $R_4$ are the same substituents as $R_1$ and $R_2$ of General Formula (1), respectively. Moreover, $Ar_4$, $Ar_5$ and $Ar_6$ are also the same substituents as $Ar_1$, $Ar_2$, and $Ar_3$ of General Formula (1), respectively.

[Chem. 6]

Structural Formula (3)

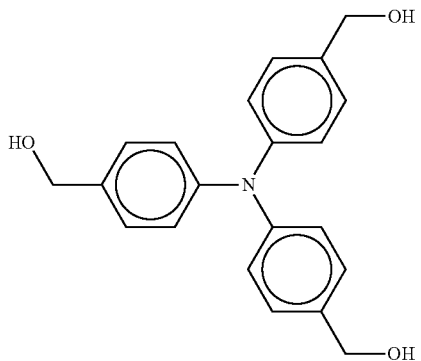

[Chem. 7]

General Formula (4)

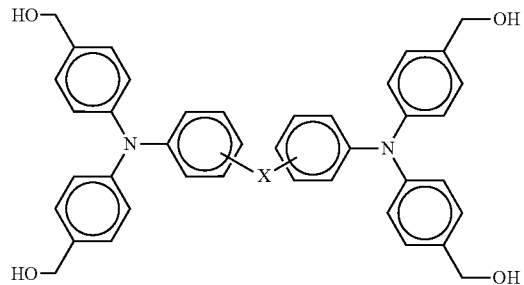

(In the formula above, X is —$CH_2$—, —O—, —CH=CH—, or —$CH_2CH_2$—.)

<<Polymethylphenylsilane>>

The polymethylphenylsilane is not particularly limited and may be appropriately selected depending on the intended purpose.

The polymethylphenylsilane may be selected from commercial products. Examples of the commercial products include OGSOL SI-10-10 available from Osaka Gas Chemicals Co., Ltd. (polymethylphenylsilane, the number average molecular weight (Mn): 2,100, the weight average molecular weight (Mw): 12,700), and OGSOL SI10-20 available from Osaka Gas Chemicals Co., Ltd. (polymethylphenylsilane, the number average molecular weight (Mn): 1,100, the weight average molecular weight (Mw): 1,800).

<<Delafossite Oxide>>

Examples of the delafossite oxide include delafossite oxides listed in the description of the metal oxide film described later.

The average thickness of the silicone-containing layer is preferably 0.1 micrometers or greater but 4.0 micrometers or less, and more preferably 0.3 micrometers or greater but 1.5 micrometers or less.

The average thickness can be measured by use of an eddy current film thickness gauge or observation of a cross-section photograph taken by a scanning electron microscope. The average thickness is an arithmetic mean value of values measured from 20 points.

One example of a method for determining the average thickness of the silicone-containing layer of the present disclosure will be described. First, a film thickness of a coating target before being coated with a silicone-containing layer is measured at 20 points at the same intervals along the longitudinal direction of the coating target by means of an eddy current film thickness gauge (FISCHERSCOPE mms, available from FISCHER INSTRUMENTS K.K.). Next, the film thickness of the target after forming a silicone-containing layer thereon is measured at the identical points, and an initial film thickness of the silicone-containing layer is determined from a difference in the film thickness of the target before and after forming the silicone-containing layer. Next, a metal oxide film is formed on the silicone-containing layer. Thereafter, part of the resultant is cut out, and the cut piece is processed by ion milling or converged ion beam processing to prepare a sample with which a smooth cross-section of the formed films can be obtained. The sample is observed under a scanning electron microscope to measure a thickness of the silicone-containing layer. The apparent film thickness of the silicone-containing layer after forming the metal oxide film may be smaller than the average film thickness determined by the eddy current film gauge because of slight erosion or embedding (anchoring) of the metal oxide. Therefore, image analysis using the cross-sectional photograph is additionally performed.

When the metal oxide is embedded in the silicone-containing layer, the thickness of the silicone-containing layer is measured at 10 points on peaks of the interface and 10 points on dips of the interface, and the average value of the measured values at the 20 points in total is determined as an average thickness. Moreover, the sample may be partially cut off at several other locations, and the similar observation is preferably performed on each of the obtained cut pieces.

A formation method of the silicone-containing layer is not particularly limited and may be appropriately selected depending on the intended purpose. Examples thereof include a method where the silicone-containing layer coating liquid is applied onto the charge-transporting layer or the sensitizing-dye electrode layer, followed by heating.

The coating method is not particularly limited and may be appropriately selected depending on the intended purpose. Examples thereof include dip coating, spray coating, ring coating, roll coating, gravure coating, nozzle coating, and screen printing.

A temperature and duration of the heating are not particularly limited and may be appropriately selected depending on the intended purpose.

The silicone-containing layer coating liquid includes, for example, an organic silicon compound having a hydroxyl group or a hydrolysable group. The silicone-containing layer coating liquid preferably includes at least one selected from the group consisting of a triphenylamine compound having a hydroxyl group, polymethylphenylsilane, and delafossite oxide. The silicone-containing layer coating liquid may further include a solvent according to the necessity.

<Metal Oxide Film>

The metal oxide film is not particularly limited and may be appropriately selected depending on the intended purpose.

The metal oxide film includes metal oxide, and preferably further includes silica.

The metal oxide is preferably a p-type semiconductor.

The metal oxide is preferably delafossite oxide.

According to one aspect of the present disclosure, the electronic device of the present disclosure has been accomplished based on the following insights. That is, an electronic device known in the art may not be able to achieve a highly uniform thickness (less variations in the film thickness) of a metal oxide film with suppressing unevenness in film formation of the metal oxide film.

According to film formation of metal oxide including p-type semiconductor using aerosol deposition known in the art, formation of the metal oxide tends to be uneven when flowability of a raw material powder is poor, and process capability is insufficient, and therefore mass production thereof as an industrial products may not be achieved.

According to one aspect of the present disclosure, a metal oxide film is disposed on a silicone-containing layer, where the metal oxide film includes metal oxide including a p-type semiconductor and silica. Therefore, unevenness of film formation of the metal oxide film can be suppressed, and an electronic device having high uniformity in a thickness of the metal oxide film with suppressing unevenness in film formation can be provided.

In the proposal in Japanese Patent No. 5664538, a protective layer includes a ceramic as a p-type semiconductor, but the ceramic is not in the form of a film, but a particulate semiconductor. FIG. 1 of Japanese Patent No. 5664538 illustrates a conceptual view in which a particulate semiconductor is dispersed in a protective layer. The film form here denotes an embodiment of the whitest surface layer seen in FIGS. 2A, 2B, and 2C.

Japanese Unexamined Patent Application Publication No. 2000-150166 discloses use of a hole-transporting layer including an inorganic p-type semiconductor, but it does not disclose that the hole-transporting layer includes silica.

Japanese Unexamined Patent Application Publication No. 2008-201004 discloses that a dense polycrystalline brittle material layer formed of particles is formed, but it does not disclose that silica is included in the particles.

<<Delafossite Oxide>>

The delafossite oxide (may be referred to as a "p-type semiconductor" or "p-type metal compound semiconductor" hereinafter) is not particularly limited and may be appropriately selected depending on the intended purpose, as long as the delafossite oxide has a function as a p-type semiconductor. Examples of the delafossite oxide include a p-type metal oxide semiconductor, a p-type metal compound semiconductor including monovalent copper, and other p-type metal compound semiconductors.

Examples of the p-type metal oxide semiconductor include CoO, NiO, FeO, $Bi_2O_3$, $MoO_2$, $Cr_2O_3$, $SrCu_2O_2$, and $CaO-Al_2O_3$.

Examples of the p-type metal compound semiconductor including monovalent copper include $Cu_2O$, CuAlO, $CuAlO_2$, and $CuGaO_2$.

Among the above-listed examples, copper aluminium oxide, such as CuAlO and $CuAlO_2$, is preferable in view of charge mobility and light transparency.

<Silica>

The silica included in the metal oxide film maybe appropriately synthesized for use, or may be selected from commercial products. Examples of the commercial products include REOLOSIL ZD-30S (available from Tokuyama Corporation), HDK H-2000 (available from Wacker Asahikasei Silicone Co., Ltd.), and AEROSIL R976 and AEROSIL RA200HS (available from NIPPON AEROSIL CO., LTD.).

An amount of the silica included in the metal oxide film is preferably 0.5% by mass or greater but 1.5% by mass or less, and more preferably 0.7% by mass or greater but 1.3% by mass or less, relative to the metal oxide film. When the amount of the silica is within the above-mentioned range, unevenness in film formation of the metal oxide film can be suppressed, and an electronic device having high uniformity in a film thickness of the metal oxide film can be obtained.

<Film Thickness of Metal Oxide Film>

The average thickness of the metal oxide film is preferably 0.3 micrometers or greater but 5 micrometers or less. It is more preferred that the average thickness of the metal oxide film be 0.3 micrometers or greater but 5 micrometers or less, and a standard deviation of the film thickness be 0.07 micrometers or less.

In case of an electrophotographic photoconductor that is one embodiment of the electronic device of the present disclosure, for example, the film thickness is measured at 5 points arranged at 50-mm intervals from 100 mm to 300 mm away from the edge of the photoconductor drum along the longitudinal direction thereof, where the photoconductor drum is a cylindrical photoconductor drum having a length of 380 mm and an outer diameter of 100 mm. The film thickness is determined through image analysis of a SEM cross-section photograph. Specifically, the drum is cut by a saw to obtain a sample, a cross-section of the sample is exposed by ion milling, and an SEM image of the cross-section is obtained. A film thickness is measured by analysis of the SEM image.

When the average thickness of the metal oxide film is 0.3 micrometers or greater but 5 micrometers or less, it is advantageous because a high quality print image having an excellent balance between abrasion resistance and electrostatic properties, and long service life can be formed. When the standard deviation of the film thickness of the metal oxide film is 0.07 micrometers or less, moreover, it is advantageous because a print image having excellent reproducibility of gradation that affects appearance of the print image of human skin or scenery.

<Method for Producing Electronic Device>

The method for producing an electronic device of the present disclosure is a production method of the electronic device of the present disclosure.

The method for producing an electronic device includes spraying raw materials of the metal oxide film onto the silicone-containing layer to form the metal oxide film. The method may further include other steps according to the necessity.

Examples of the raw materials include metal oxide and silica.

A method for spraying the raw materials of the metal oxide film is not particularly limited and may be appropriately selected from typical film formation methods of inorganic materials depending on the intended purpose. Examples thereof include a vapor deposition method, a liquid phase growth method, and a solid phase growth method.

The vapor deposition method is classified, for example, into a physical vapor deposition method (PVD) and a chemical vapor deposition method (CVD).

Examples of the physical vapor deposition method include vacuum vapor deposition, electron beam vapor deposition, laser abrasion, laser abrasion MBE, MOMBE, reactive vapor deposition, ion plating, cluster ion beam, glow discharge sputtering, ion beam sputtering, and reactive sputtering.

Examples of the chemical vapor deposition method include thermal CVD, MOCVD, RF plasma CVD, ECR plasma CVD, photo CVD, and laser CVD.

Examples of the liquid phase growth method include LPE, electroplating, electroless plating, and coating.

Examples of the solid phase growth method include SPE, recrystallization, graphoepitaxy, the LB method, the sol-gel method, and aerosol deposition (AD). Among the above-listed examples, AD is preferable because AD does not adversely affect uniform film formation of a film over a relatively large area, such as an electrophotographic photoconductor or properties of the electrophotographic photoconductor. In other words, the method for spraying the raw materials of the metal oxide film is preferably spraying raw material particles of the metal oxide film onto the silicone-containing layer through aerosol deposition.

Examples of the particles of the raw materials include metal oxide particles and silica particles.

<Aerosol Deposition (AD)>

The aerosol deposition (AD) is a technique where particles or microparticles prepared in advance are mixed with gas to form aerosol, and the aerosol is jetted via a nozzle to a film formation target (substrate) to form a film.

As characteristics of the AD, film formation can be performed in a room temperature environment, and film formation can be performed in a state where a crystal structure of a raw material is maintained substantially the same. Therefore, the AD is suitable for film formation performed in an electronic device (particularly an electrophotographic photoconductor).

One example of a method for forming the metal oxide film according to the aerosol deposition will be described.

In this method, an aerosol deposition device as illustrated in FIG. 3 is used. A gas cylinder 110 illustrated in FIG. 3 stores inert gas for generating aerosol. The gas cylinder 110 is linked to an aerosol generator 130 via a pipe 120a, and the pipe 120a is guided inside the aerosol generator 130. A certain amount of particles 200 formed of metal oxide or a compound semiconductor is placed inside the aerosol generator 130. Another pipe 120b linked to the aerosol generator 130 is coupled with a jet nozzle 150 inside a film formation chamber 140.

The particles 200 formed of p-type semiconductor metal oxide and silica are introduced into the aerosol generator 130 and aerosol is generated, and the generated aerosol is lead to the jet nozzle 150 via the pipe 120b. Alternatively, aerosol of p-type semiconductor metal oxide is generated by the aerosol generator (not illustrated) including therein p-type semiconductor metal oxide, and aerosol of silica is generated by the aerosol generator (not illustrated) including therein the silica, and the generated aerosols are transported through pipes and ejected from 2 nozzles, respectively, towards a substrate at high speed.

Inside the film formation chamber 140, the substrate 160 is held by the substrate holder 170 to face the jet nozzle 150. As the substrate 160, a cylindrical conductive support, or an electronic device, such as a photoconductor, a solar cell, and an EL element, may be used. An exhaust pump 180 for adjusting the degree of vacuum inside the film formation chamber 140 is connected to the film formation chamber 140 via the pipe 120c.

Although it is not illustrated, the film formation device for forming an electrode of the present embodiment includes a system configured to laterally move the jet nozzle 150 at high speed, while rotating the substrate holder 170 with a rotating unit 170a. A metal oxide film of a desired area can be formed on the substrate 160 by performing film formation with laterally moving the jet nozzle 150.

In the process for forming the metal oxide film, first, a compression valve 190 is closed to make the internal atmosphere from the film formation chamber 140 to the aerosol generator 130 vacuum using the exhaust pump 180. Next, the compression valve 190 is open to introduce the gas inside the gas cylinder 110 into the aerosol generator 130 into the aerosol generator 130 via the pipe 120a to scatter the particles 200 inside the vessel. As a result, aerosol in the state where the particles 200 are dispersed in the gas is generated. The generated aerosol is jetted at high speed by the jet nozzle 150 via the pipe 120b towards the substrate 160. As 0.5 seconds passes in the state where the compression valve 190 is open, the compression valve 190 is then closed for the following 0.5 seconds. Thereafter, the compression valve 190 is open again. Opening and closing of the compression valve 190 are repeatedly performed every 0.5 seconds. A flow rate of the gas from the gas cylinder 110 is 2 L/min, the film formation duration is 1 hour, the degree of vacuum inside the film formation chamber 140 when the compression valve 190 is closed is about 10 Pa, and the degree of vacuum inside the film formation chamber 140 when the compression valve 190 is open is about 100 Pa.

The jet speed of the aerosol is controlled by the shape of the jet nozzle 150, the length or inner diameter of the pipe 120b, the internal gas pressure of the gas cylinder 110, or the amount of the gas discharged by the exhaust pump 180 (internal pressure of the film formation chamber 140). When the internal pressure of the aerosol generator 130 is several tens thousands Pa, the internal pressure of the film formation chamber 140 is several hundreds Pa, and the shape of opening of the jet nozzle 150 is a circle having an internal diameter of 1 mm, for example, the jet speed of the aerosol can be set to several hundreds meters per second by the internal pressure difference between the aerosol generator 130 and the film formation chamber 140. When the internal pressure of the film formation chamber 140 is maintained to the range of 5 Pa or greater but 100 Pa or less and the internal pressure of the aerosol generator 130 is maintained to 50,000 Pa, a metal oxide layer having porosity of 5% or greater but 30% or less can be formed. The average thickness of the metal oxide film is preferably adjusted to the range of 0.1 micrometers or greater but 10 micrometers or less by adjusting the duration for supplying the aerosol under the above-mentioned conditions.

The average thickness of the metal oxide film may be adjusted to an appropriate thickness relative to each electronic device.

In case of an electrophotographic photoconductor that is an example of the electronic device, the preferable average thickness of the metal oxide film is 1.2 micrometers or greater but 1.8 micrometers or less as a condition for obtaining a best mode for durability of the electronic device and high print quality.

The particles 200, which have attained kinetic energy through acceleration in aerosol, are crushed into the substrate 160, and the particles 200 are finely pulverized by the collision energy. When the pulverized particles are bonded to the substrate 160 and the pulverized particles are bonded to one another, a metal oxide film is sequentially formed on a charge-transporting layer.

The film formation is performed together with patterning using a line pattern a few time, or rotation of a photoconductor drum. The metal oxide film of a desired area is formed by scanning the substrate holder 170 or the jet nozzle 150 in a longitudinal direction and lateral direction of the substrate 160.

Examples of an embodiment of the electronic device of the present disclosure will be listed below.

<1: Electrophotographic Photoconductor and Electrophotographic Device>

One embodiment of the electronic device of the present disclosure is an electrophotographic photoconductor.

The electrophotographic photoconductor (may be referred to as a "photoconductor" hereinafter) includes a conductive support serving as a support, a charge-transporting layer including a charge-transporting material, where the charge-transporting layer is disposed on or above the conductive support, a silicone-containing layer disposed on or above the charge-transporting layer, and the metal oxide film disposed on or above the silicone-containing layer. The electrophotographic photoconductor may further include other layers, such as a charge-generating layer, an intermediate layer, and a protective layer, according to the necessity.

The silicone-containing layer is as described earlier.

The metal oxide film is as described earlier.

Note that a layer obtained by sequentially laminating a charge-generating layer and a charge-transporting layer may be referred to as a photosensitive layer.

An example where the electronic device is an electrophotographic photoconductor will be described hereinafter, but the electronic device is not limited to the electrophotographic photoconductor and may be applied as other embodiments of an electronic devices.

A structure of the electronic device, which is an electrophotographic photoconductor 10A, will be described with reference to FIG. 4. FIG. 4 is a cross-sectional view illustrating one example of the electrophotographic photoconductor. One embodiment of the electrophotographic photoconductor is depicted in FIG. 4. In the embodiment of FIG. 4, the electrophotographic photoconductor 10A includes an intermediate layer 52, a charge-generating layer 53, a charge-transporting layer 54, a silicone-containing layer 55, and a metal oxide film 56 on a conductive support 51 in this order. The intermediate layer 52 may be appropriately omitted.

<Support (Conductive Support)>

The conductive support is not particularly limited and may be appropriately selected depending on the intended purpose, as long as the conductive support exhibits conductivity of a volume resistance value of $10^{10}$ ohm cm or less. Examples thereof include: film or cylindrical plastics or paper coated with metal (e.g., aluminium, nickel, chromium, Nichrome, copper, silver, gold, platinum, and iron) or oxide (e.g., tin oxide, and indium oxide) by vapor deposition or sputtering: and tubes obtained by turning a plate of aluminium, aluminium alloy, nickel, stainless steel, etc., into a tube by a method, such as drawing ironing, impact ironing, extruded ironing, extruded drawing, and machining, followed by a surface treatment, such as machining, superfinishing, and polishing.

<Intermediate Layer>

The electrophotographic photoconductor may include an intermediate layer disposed between the conductive support and the photosensitive layer. The intermediate layer is disposed for the purpose of improving adhesion, prevention of moire, improvement of coatability of an upper layer, and prevention of charges injected from the conductive support.

The intermediate layer typically includes a resin as a main component. Since the photosensitive layer is applied on the intermediate layer, a resin used in the intermediate layer is preferably a thermoset resin that is poorly soluble to an organic solvent. Among thermoset resins, polyurethane, a melamine resin, and an alkyd-melamine resin are more preferable as the resin for the intermediate layer because many of the above-listed resins achieve the above-described purposes.

Examples of the organic solvent include tetrahydrofuran, cyclohexanone, dioxane, dichloroethane, and butanone. A coating material of the intermediate layer can be prepared by appropriately diluting the resin with the organic solvent.

Moreover, particles of metal, metal oxide, etc., may be added to the intermediate layer for the purpose of adjusting conductivity or preventing moire. The metal oxide is preferably titanium oxide or zinc oxide. A coating material of the intermediate layer can be prepared by dispersing the particles in the organic solvent by means of a ball mill, an attritor, a sand mill, etc. to prepare a dispersion liquid, and mixing the dispersion liquid and the resin component.

Examples of a production method (film formation method) of the intermediate layer include: a method where a film is formed by applying the coating material on the conductive support by dip coating, spray coating, bead coating, etc.; and a method where an obtained film is optionally heated to cure. The average thickness of the intermediate layer is often appropriately about 2 micrometers or greater but about 20 micrometers or less. When residual potentials of the photoconductor are excessively accumulated, the average thickness of the intermediate layer may be less than 3 micrometers.

<Photosensitive Layer>

The photosensitive layer of the electrophotographic photoconductor is a laminate photosensitive layer, in which a charge-generating layer and a charge-transporting layer are laminated in this order.

<Charge-Generating Layer>

The charge-generating layer is part of the laminate photosensitive layer. The charge-generating layer, which has a function of generating charges as a result of exposure, includes a charge-generating material as a main component, and may further include a binder resin according to the necessity. Examples of the charge-generating material include an inorganic charge-generating material and an organic charge-generating material.

Examples of the inorganic charge-generating material include crystal selenium, amorphous selenium, selenium-tellurium, selenium-tellurium-halogen, a selenium-arsenic compound, and amorphous silicon. As the amorphous silicon, amorphous silicon in which a dangling bond is terminated with a hydrogen atom or a halogen atom, and amorphous silicon doped with a boron atom, a phosphorus atom, etc. are preferably used.

As the organic charge-generating material, known materials can be used. Examples thereof include: metal phthalocyanine, such as titanyl phthalocyanine, and chlorogallium phthalocyanine; metal-free phthalocyanine; an azulenium salt pigment; a squaric acid methine pigment; a symmetric or asymmetric azo pigment having a carbazole skeleton; a symmetric or asymmetric azo pigment having a triphenylamine skeleton; a symmetric or asymmetric azo pigment having a fluorenone skeleton; and a perylene-based pigment. Among the above-listed examples, metal phthalocyanine, a symmetric or asymmetric azo pigment having a fluorenone skeleton, a symmetric or asymmetric azo pigment having a triphenylamine skeleton, and a perylene-based pigment are preferable because quantum efficiency of charge generation is extremely high. The above-listed charge-generating materials may be used alone or in combination.

Examples of the binder resin include polyamide, polyurethane, an epoxy resin, polyketone, polycarbonate, polyacrylate, a silicone resin, an acryl resin, polyvinyl butyral, polyvinyl formal, polyvinyl ketone, polystyrene, poly-N-vinylcarbazole, and polyacrylamide.

Among the above-listed examples, polyvinyl butyral is often used and is effective. The above-listed binder resins may be used alone or in combination.

<Production Method of Charge-Generating Layer>

A production method of the charge-generating layer is, for example, roughly classified into a vacuum thin film formation method and a casting method of a solution dispersion system.

Examples of the vacuum thin film formation method include vacuum vapor deposition, glow discharge decomposition, ion plating, sputtering, reactive sputtering, and chemical vapor deposition (CVD). The above-listed methods are suitably used for production of a layer formed of the inorganic charge-generating material or the organic charge-generating material.

As the production method of the charge-generating layer by the casting method, for example, the inorganic charge-generating material or the organic charge-generating material is dispersed in an organic solvent optionally together with a binder resin by means of a ball mill, an attritor, a sand mill, etc., to prepare a dispersion liquid, the dispersion liquid is appropriately diluted, and a resultant is coated.

Examples of the organic solvent include tetrahydrofuran, cyclohexanone, dioxane, dichloroethane, and butanone. Among the above-listed examples, methyl ethyl ketone, tetrahydrofuran, and cyclohexanone are preferable because the above-mentioned solvents have low environmental loads compared with chlorobenzene, dichloromethane, toluene, and xylene.

The coating can be performed by dip coating, spray coating, bead coating, etc.

The average thickness of the charge-generating layer is preferably 0.01 micrometers or greater but 5 micrometers or less.

When reduction in residual potentials and high sensitivity are important, an increase in a thickness of the charge-generating layer may often improve the above-mentioned properties. On the other hand, the thick charge-generating layer may often cause deteriorations of chargeability, such as retention of charges or formation of space charge. To balance between the above-mentioned advantages and the above-mentioned disadvantages, the average thickness of the charge-generating layer is more preferably 0.05 micrometers or greater but 2 micrometers or less.

Moreover, a low molecular compound, such as an antioxidant, a plasticizer, a lubricant, and a UV absorber, and a leveling agent may be optionally added to the charge-generating layer. The above-listed compounds may be used alone or in combination. When the low molecular compound and the leveling agent are used in combination with other components of the charge-generating layer, sensitivity may be often deteriorated. Therefore, an amount of the low molecular compound and the leveling agent is generally preferably 0.1 phr or greater but 20 phr or less, and more preferably 0.1 phr or greater but 10 phr or less. The amount of the leveling agent for use is preferably 0.001 phr or greater but 0.1 phr or less.

<Charge-Transporting Layer>

The charge-transporting layer is part of the laminate photosensitive layer, and has a function of injecting and transporting charges generated in the charge-generating layer to neutralize the surface charge of the charged photoconductor. The charge-transporting layer includes a charge-transporting material and a binder component binding the charge-transporting material, as main components.

The charge-transporting material includes an electron-transporting material and a hole-transporting material.

Examples of the electron-transporting material include an electron-accepting material, such as an asymmetric diphenoquinone derivative, a fluorene derivative, and a naphthalimide derivative. The above-listed electron-transporting material may be used alone or in combination.

As the hole-transporting material, an electron-donating material is preferably used. Examples thereof include an oxazole derivative, an oxadiazole derivative, an imidazole derivative, a triphenylamine derivative, a butadiene derivative, 9-(p-diethylaminostyrylanthracene), 1,1-bis-(4-dibenzylaminophenyl)propane, styryl anthracene, styryl pyrazoline, phenyl hydrozone, an α-phenylstilbene derivative, a thiazole derivative, a triazole derivative, a fenadine derivative, an acridine derivative, a benzofuran derivative, a benzimidazole derivative, and a thiophene derivative. The above-listed hole-transporting materials may be used alone or in combination.

Examples of the binder component include a thermoplastic or thermoset resin, such as polystyrene, polyester, polyvinyl, polyacrylate, polycarbonate, an acrylic resin, a silicone resin, a fluororesin, an epoxy resin, a melamine resin, a urethane resin, a phenol resin, and an alkyd resin. Among the above-listed examples, polystyrene, polyester, polyacrylate, and polycarbonate are effectively used as a binder component of the charge-transporting component because many of them exhibit excellent charge-transporting properties.

When an electrically inert polymer compound is used for modification of the charge-transporting layer, a cardo polymer-type polyester having a bulky skeleton, such as fluorene, polyester (e.g., polyethylene terephthalate and polyethylene naphthalate), polycarbonate, in which the 3,3' site of a phenol component of bisphenol polycarbonate, such as C-type polycarbonate, is substituted with alkyl, polycarbonate in which a geminal methyl group of bisphenol A is substituted with a long-chain alkyl group having 2 or more carbon atoms, polycarbonate having a biphenyl or biphenyl ether skeleton, polycaprolactone, polycarbonate having a long-chain alkyl skeleton, such as polycaprolactone, an acrylic resin, polystyrene, hydrogenated butadiene, etc. are effective.

In the present specification, the term "electrically inert polymer compound" denotes a polymer compound free from a chemical structure exhibiting photoconductivity, such as a triarylamine structure. When such a resin is used as an additive together with a binder resin, an amount thereof is preferably 50% by mass or less relative to a total solid content of the charge-transporting layer considering the restriction associated with optical extinction sensitivity.

When the charge-transporting material is used, an amount of the charge-transporting material is generally preferably 40 phr or greater but 200 phr or less, and more preferably 70 phr or greater but 100 phr or less. Preferably used is a copolymer, in which the resin component is copolymerized in an amount of 0 parts by mass or greater but 200 parts by mass or less, preferably about 80 parts by mass or greater but about 150 parts by mass or less, relative to 100 parts by mass of the charge-transporting component.

The charge-transporting layer can be formed, for example, by dissolving or dispersing a mixture or a copolymer including a charge-transporting component and a binder component as main components in an appropriate solvent to prepare a charge-transporting layer coating material, and applying and drying the coating material. As the coating method, dip coating, spray coating, ring coating, roll coater coating, gravure coating, nozzle coating, screen printing, etc. may be used.

Examples of the dispersing solvent used when the charge-transporting layer coating material is prepared include: ketones, such as methyl ethyl ketone, acetone, methyl isobutyl ketone, and cyclohexanone; ethers, such as dioxane, tetrahydrofuran, and ethyl cellosolve; aromatics, such as toluene, and xylene; halogens, such as chlorobenzene, and dichloromethane; and esters, such as ethyl acetate and butyl acetate. Among the above-listed examples, methyl ethyl ketone, tetrahydrofuran, and cyclohexanone are preferable because the solvents as mentioned have low environmental loads compared with chlorobenzene, dichloromethane, toluene, and xylene. The above-listed solvents may be used alone or in combination.

A cross-linked surface layer may be disposed above the charge-transporting layer. With such a structure, it is not necessary to set the average thickness of the charge-transporting layer considering abrasion occurred during use. When sensitivity and chargeability required for practical use are secured, the average thickness of the charge-transporting layer is preferably 10 micrometers or greater but 40 micrometers or less, and more preferably 15 micrometers or greater but 30 micrometers or less.

Moreover, a low molecular compound, such as an antioxidant, a plasticizer, a lubricant, and a UV absorber, and a leveling agent may be optionally added to the charge-transporting layer. When the low molecular compound and the leveling agent are used in combination with other components of the charge-transporting layer, sensitivity may be often deteriorated. Therefore, an amount of the above-listed compounds is generally 0.1 phr or greater but 20 phr or less, and preferably 0.1 phr or greater but 10 phr or less. An amount of the leveling agent is appropriately about 0.001 phr or greater but about 0.1 phr or less.

<Silicone-Containing Layer>

The silicone-containing layer of the electrophotographic photoconductor is appropriately selected from description of the silicone-containing layer of the electronic device of the present disclosure.

<Metal Oxide Film>

The metal oxide film of the electrophotographic photoconductor and a production method thereof are appropriately selected from the detailed descriptions of the metal oxide film of the electronic device of the present disclosure and the production method thereof.

<Image Forming Apparatus and Image Forming Method>

The image forming apparatus of the present disclosure includes the electronic device. For example, the electronic device is the electrophotographic photoconductor.

An embodiment of the image forming apparatus of the present disclosure includes the electrophotographic photoconductor (electronic device). The image forming apparatus further includes an electrostatic latent image forming unit and a developing unit, and may further include other units according to the necessity.

The image forming method of the present disclosure uses the electronic device. For example, the electronic device is the electrophotographic photoconductor.

An embodiment of the image forming method of the present disclosure includes at least an electrostatic latent image forming step, and a developing step, and may further include other steps according to the necessity.

The image forming method is suitably performed by the image forming apparatus, the electrostatic latent image forming step is suitably performed by the electrostatic latent image forming unit, the developing step is suitably performed by the developing unit, and the above-mentioned other steps are suitably performed by the above-mentioned other units.

<Embodiments of Image Forming Apparatus>

Structural examples of the image forming apparatus will be described with reference to drawings hereinafter.

An example of the image forming apparatus is illustrated in FIG. 5. The charging device 12 is a unit configured to uniformly charge a surface of the electrophotographic photoconductor 11. As the charging device 12, any of known units, such as a corotron, a scorotron, a solid state charger, and a charging roller, may be used. The charging device 12 is preferably used to be arranged in contact with or adjacent to the electrophotographic photoconductor 11 in view of reduction in power consumption. In order to prevent contamination of the charging device 12, preferred is a charging system that is disposed adjacent to the electrophotographic photoconductor 11 having an appropriate gap between the electrophotographic photoconductor 11 and a surface of the charging device 12. Typically, the above-described charger can be used as a transferring device 16. As the transferring device 16, a combination of a transfer charger and a separation charger is effective.

The electrophotographic photoconductor 11 is driven by a driving unit 1C. Charging by the charging device 12, image exposure by the exposing device 13, developing, transferring by the transferring device 16, pre-cleaning exposure by the pre-cleaning exposing device 1B, cleaning by the cleaning device 17, and charge elimination by the charge eliminating device 1A are repetitively performed. A lubricant 3A, a coating brush 3B for coating the lubricant, and a coating blade 3C are disposed between the cleaning device 17 and the charging device 12 along the traveling direction of the electrophotographic photoconductor 11, as illustrated in FIG. 5.

In FIG. 5, light for pre-cleaning exposure is applied from the side of the support of the electrophotographic photoconductor 11 (in this case, the support is transparent to light).

The above-described photoelectric process is an example. For example, the pre-cleaning exposure is performed from the side of the support in FIG. 5, but the pre-cleaning exposure may be performed from the side of the photosensitive layer. Moreover, application of image exposure light and charge-elimination light may be performed from the side of the support. Meanwhile, image exposure light, pre-cleaning exposure light, and charge-eliminating light are illustrated as the light irradiation steps. However, other than the light irradiation steps, transfer pre-exposure, pre-exposure of image exposure, and other light irradiation steps known in the art may be performed to perform light irradiation on the electrophotographic photoconductor.

Moreover, the above-described image forming unit may be fixed and integrated with a photocopier, a facsimile, or a printer. Alternatively, the image forming unit may be integrated with any of the above-mentioned devices in the form of a process cartridge. Many examples of a shape of the process cartridge may be listed, but as a typical example, the shape illustrated in FIG. 6 is listed. The electrophotographic photoconductor 11 has a drum shape, but the electrophotographic photoconductor 11 may be in the shape of a sheet, or an endless belt.

The process cartridge includes at least an electrophotographic photoconductor bearing an electrostatic latent image thereon, a developing unit configured to develop the electrostatic latent image born on the electrophotographic photoconductor with a toner to form a visible image, and a lubricant supplying unit configured to supply a lubricant onto the electrophotographic photoconductor. The process cartridge may further include appropriately selected other units, such as a charging unit, an exposing unit, a transferring unit, a cleaning unit, and a charge-eliminating unit according to the necessity. The developing unit includes at least a developer container configured to store thereon a toner or a developer, and a developer bearer configured to bear and transport the toner or developer stored in the developer container. The developing unit may further include a layer thickness regulating member configured to regulate a thickness of a toner layer born on the developer bearer. The process cartridge can be detachably mounted in various electrophotographic image forming apparatuses, facsimiles, and printers, and is particularly preferably detachably mounted in the image forming apparatus of the present disclosure.

FIG. 7 illustrates another example of the image forming apparatus. In the image forming apparatus, a charging device 12, an exposing device 13, black (Bk), cyan (C), magenta (M), and yellow (Y) developing devices 14Bk, 14C, 14M, and 14Y, an intermediate transfer belt 1F that is an intermediate transfer member, and a cleaning device 17 are disposed in the periphery of the electrophotographic photoconductor 11 in this order.

Note that, the letters (Bk, C, M, and Y) depicted in FIG. 7 denote colors of the toner, and are appropriately omitted, if necessary. Each color of the developing devices 14Bk, 14C, 14M, and 14Y can be independently controlled, and only the developing device of the color used for image formation is driven. A toner image formed on the electrophotographic photoconductor 11 is transferred onto the intermediate transfer belt 1F by a first transferring device 1D disposed at the inner side of the intermediate transfer belt 1F.

The first transferring device 1D is disposed in the manner that the first transferring device 1D can be in contact with the electrophotographic photoconductor 11, and the intermediate transfer belt 1F is brought into contact with the electrophotographic photoconductor 11 only during a transfer operation. Image formation of each color is performed, and toner images superimposed on the intermediate transfer belt 1F are collectively transferred onto a print medium 18 by a second transferring device 1E, followed by fixing by a fixing device 19 to form an image. The second transferring device 1E is also disposed in the manner that the second transferring device 1E can be in contact with the intermediate transfer belt 1F, and is brought into contact with the intermediate transfer belt 1F only during a transfer operation.

In the image forming apparatus of the transfer drum-system, toner images of different colors electrostatically attracted to the transfer drum are sequentially transferred to a print medium, and therefore there is a restriction that the image forming apparatus of the transfer drum-system cannot perform printing on thick paper. Meanwhile, in the image forming apparatus of the intermediate transfer system, as illustrated in FIG. 7, toner images of different colors are superimposed on the intermediate transfer belt 1F. Therefore, there is no restriction in print media for use. The above-described intermediate transfer system can be applied to, not only the device illustrated in FIG. 7, but also image forming apparatuses as illustrated in FIGS. 5, 6, 8, and 9.

The lubricant 3A, and the coating brush 3B and coating blade 3C for coating the lubricant are disposed between the cleaning device 17 and the charging device 12 relative to the rotational direction of the electrophotographic photoconductor 11, as illustrated in FIG. 7.

FIG. 8 illustrates another example of the image forming apparatus. The image forming apparatus uses 4 colors of toners, i.e., yellow (Y), magenta (M), cyan (C), and black (Bk), and an image forming unit for each color is disposed in the image forming apparatus. Moreover, electrophotographic photoconductors for the 4 colors 11Y, 11M, 11C, and 11Bk are disposed. At the periphery of each electrophotographic photoconductor 11Y, 11M, 11C, or 11Bk, a charging device 12Y, 12M, 12C, or 12Bk, an exposing device 13Y, 13M, 13C, or 13Bk, a developing device 14Y, 14M, 14C, or 14Bk, a cleaning device 17Y, 17M, 17C, or 17Bk, etc. are disposed.

Moreover, a conveying transfer belt 1G, which is a transfer material bearer that is brought in and out each of transfer positions of the electrophotographic photoconductors 11Y, 11M, 11C, and 11Bk disposed along a straight line, is held with a driving unit 1C. Transferring devices 16Y, 16M, 16C, and 16Bk are disposed at the transfer positions facing the electrophotographic photoconductors 11Y, 11M, 11C, and 11Bk, respectively, via the conveying transfer belt 1G.

The tandem system image forming apparatus illustrated in FIG. 8 includes an electrophotographic photoconductor for each color 11Y, 11M, 11C, or 11Bk, and toner images of all colors are sequentially transferred onto a print medium held on a conveying transfer belt 1G. Therefore, the tandem system image forming apparatus can output a full color image at significantly high speed compared with a full-color image forming apparatus including only one electrophotographic photoconductor. A toner image developed on the print medium 18 serving as a transfer material is transported to a fixing device 19 from the position at which the electrophotographic photoconductor 11Bk and the transferring device 16Bk face each other, and the toner image is fixed on the print medium 18 by the fixing device 19.

Moreover, the image forming apparatus may have a structure in an embodiment illustrated in FIG. 9. Specifically, the structure using the intermediate transfer belt 1F as illustrated in FIG. 9 can be used, instead of a direct transfer system using the conveying transfer belt 1G illustrated in FIG. 8.

In the example illustrated in FIG. 9, the image forming apparatus includes an electrophotographic photoconductor for each color 11Y, 11M, 11C, or 11Bk, toner images of all colors formed by the electrophotographic photoconductors are sequentially transferred and laminated onto the intermediate transfer belt 1F that is driven and supported by the driving unit 1C that includes rollers by a primary transferring unit 1D that is a first transferring unit, to thereby form a full-color image.

Next, the intermediate transfer belt 1F is further driven, and the full-color image born thereon is transported to a position at which a secondary transferring unit 1E that is the second transferring device and the roller disposed to face the secondary transferring unit 1E. Then, the full-color image is secondary transferred onto a printing medium 18 by the secondary transferring unit 1E, to thereby form a desired image on the transfer material.

<2: Solar Cell>

An embodiment of the electronic device of the present disclosure is a solar cell. The solar cell includes a support, a sensitizing-dye electrode layer including a sensitizing dye, a silicone-containing layer disposed on or above the sensitizing-dye electrode layer, and the metal oxide film disposed on or above the silicone-containing layer. The solar cell further includes a first electrode, a hole-blocking layer, and a second electrode, and may further include other members according to the necessity. The silicone-containing layer is as described earlier.

The metal oxide film is as described earlier.

The example where the electronic device is a solar cell will be described hereinafter, but the electronic device is not limited to a solar cell and may be applied as other embodiments of an electronic devices.

The solar cell of the present disclosure will be described with reference to drawings hereinafter. Note that, the present disclosure is not limited to the embodiments described below. The embodiments described below may be changed. For example, another embodiments may be used, or additions, corrections, or omissions may be performed in the below-described embodiments within the range with that a person skilled in the art can be arrived. Any of the above-mentioned embodiments are included in the scope of the present disclosure as long as the functions and effects of the present disclosure are exhibited.

The solar cell includes a substrate serving as a support, a first electrode, a hole-blocking layer, an electron-transporting layer, a sensitizing-dye electrode layer, a silicone-containing layer, a ceramic semiconductor film serving as a metal oxide film, and a second electrode.

The structure of the electronic device 10B, which is a solar cell, will be described with reference to FIG. 10. FIG. 10 is a cross-sectional view illustrating one example of the solar cell.

In the embodiment of FIG. 10, a first electrode 2 is formed on a substrate 1 serving as a support, a hole-blocking layer 3 is formed on the first electrode 2, and a sensitizing-dye electrode 5, in which a photosensitizing material 4' is adsorbed on an electron-transporting material 4, is disposed on the hole-blocking layer 3. The illustrated example has a structure where a silicone-containing layer 6 and a metal oxide film 7 are sandwiched between the first electrode 2 and a second electrode 8 facing the first electrode 2. In FIG. 10, moreover, lead lines 9 and 10 are disposed to electrically connect between the first electrode 2 and the second electrode 8.

The materials of the metal oxide film 7 may be bled into the sensitizing-dye electrode layer, and the materials of the sensitizing-dye electrode layer may be bled into the metal oxide film 7.

The details will be described hereinafter.

<Support (Substrate)>

A substrate 1 serving as the support is not particularly limited and can be selected from substrates known in the art. The substrate 1 is preferably a transparent material. Examples thereof include glass, a transparent plastic plate, a transparent plastic film, and an inorganic transparent crystal.

<First Electrode>

The first electrode 2 is not particularly limited as long as the first electrode 2 is a conductive material transparent to visible light. As the first electrode 2, electrodes known in the art, such as a general photoelectric conversion element, and a liquid crystal panel, can be used.

Examples of a material of the first electrode include indium-tin oxide (referred to as ITO hereinafter), fluorine-doped tin oxide (referred to as FTO hereinafter), antimony-doped tin oxide (referred to as ATO hereinafter), indium-zinc oxide, niobium-titanium oxide, and graphene. The above-listed materials may be used alone or in combination as a laminate.

The average thickness of the first electrode is preferably 5 nm or greater but 10 micrometers or less, and more preferably 50 nm or greater but 1 micrometer or less.

In order to maintain certain hardness, moreover, the first electrode is preferably disposed on the substrate 1 formed of a material transparent to visible light. As the substrate, for example, glass, a transparent plastic plate, a transparent plastic film, an inorganic transparent crystal, etc. is used.

The first electrode integrated with the substrate known in the art may be used. Examples thereof include FTO-coated glass, ITO-coated glass, zinc oxide: aluminium-coated glass, an FTO-coated transparent plastic film, an ITO-coated transparent plastic film.

Moreover, the first electrode may be a transparent electrode prepared by doping tin oxide or indium oxide with a cation or anion having a different valency, and a metal electrode having a structure that can pass through light, such as mesh or stripes, disposed on a substrate, such as a glass substrate.

The above-listed examples may be used alone, or a mixture, or a laminate.

Moreover, a metal lead wire etc. may be used in combination for the purpose of reducing resistance.

Examples of a material of the metal lead wire include metals, such as aluminium, copper, silver, gold, platinum, and nickel. The metal lead wire is disposed on the substrate by vapor deposition, sputtering, pressure bonding, etc., and ITO or FTO is disposed thereon.

<Hole-Blocking Layer>

A material constituting the hole-blocking layer 3 is not particularly limited as long as the material is transparent to visible light and is an electron-transporting material. The material thereof is particularly preferably titanium oxide. The hole-blocking layer is disposed to suppress a reduction in electricity caused by recombination (i.e., reverse electron transport) between a hole in an electrolyte and an electron present at a surface of an electrode when the electrode is brought into contact with the electrolyte hole-blocking layer. The above-described effect of the hole-blocking layer 3 is especially significantly exhibited with a solid dye-sensitized solar cell. This is because a solid dye-sensitized solar cell using an organic hole-transporting material etc. has high recombination (reverse electron transport) speed between a hole in the hole-transporting material and an electron present at the surface of the electrode, compared with a wet dye-sensitized solar cell using an electrolyte solution.

A method for forming the hole-blocking layer is not particularly limited, but having high internal resistance is important to prevent current loss due to room light. Therefore, the method for forming the hole-blocking layer is also important. Examples thereof typically include a sol gel method that is a wet film formation. The sol gel method may not be able to sufficiently present loss current. Therefore, the method thereof is more preferably dry film formation, such as sputtering, and the dry film formation can give sufficiently high film density and can prevent current loss.

The hole-blocking layer is formed for the purpose of preventing electronic contact between the first electrode and the hole-transporting layer. The average thickness of the hole-blocking layer is not particularly limited. The average thickness of the hole-blocking layer is preferably from 5 nm through 1 micrometer. In wet film formation, the average thickness thereof is more preferably from 500 nm through 700 nm. In dry film formation, the average thickness thereof is more preferably from 10 nm through 30 nm.

<Sensitizing-Dye Electrode Layer>

The solar cell includes a porous electron-transporting layer disposed on the hole-blocking layer 3. The electron-transporting layer may be a single layer or a multiple layer.

The electron-transporting layer is formed of an electron-transporting material. As the electron-transporting material, semiconductor particles are preferably used.

In case of the multiple layer, dispersion liquids each including semiconductor particles of different particle size may be applied to form multiple layers, or coating layers each including different types of semiconductor particles, or each having different compositions of resins or additives may be provided to form multiple layers. The multiple layer coating is effective when a sufficient average thickness cannot be provided with one coating.

As the average thickness of the sensitizing dye layer increases, generally, an amount of the born photosensitizing material per unit projection area increases, and therefore a capturing rate of light increases. However, a diffusion length of injected electrons increases, and therefore a loss of charges due to recombination also increases. Accordingly, the average thickness of the electron-transporting layer is preferably 100 nm or greater but 100 micrometers or less.

The semiconductor is not particularly limited, and any of semiconductors known in the art can be used as the semiconductor. Specific examples thereof include: single semiconductors, such as silicon and germanium; compound semiconductors, such as metal chalcogenide; and a compound having the Perovskite structure.

Examples of the metal chalcogenide include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium.

Examples of other compound semiconductors include: phosphides of zinc, gallium, indium, and cadmium; gallium arsenide; copper-indium-selenide; and copper-indium-sulfide.

Moreover, the compound having the Perovskite structure is preferably strontium titanate, calcium titanate, sodium titanate, barium titanate, or potassium niobate.

Among the above-listed examples, oxide semiconductors are preferable, and titanium oxide, zinc oxide, tin oxide, and niobium oxide are particularly preferable. The above-listed examples may be used alone or in combination as a mixture. A crystal type of the above-listed semiconductors is not particularly limited. The crystal type thereof may be a single crystal, polycrystalline, or amorphous.

The average particle diameter of primary particles of the semiconductor particles is not particularly limited. The average particle diameter thereof is preferably 1 nm or greater but 100 nm or less, and more preferably 5 nm or greater but 50 nm or less.

Moreover, the efficiency can be improved by mixing or laminating semiconductor particles having the larger average particle diameter owing to an effect of scattering incident light. In this case, the average particle diameter of the semiconductor is preferably 50 nm or greater but 500 nm or less.

A production method of the electron-transporting layer is not particularly limited. The production method thereof includes a method for forming a thin film in vacuum, such as sputtering, and a wet film forming method.

In view of production cost, a wet film formation method is particularly preferable. Preferred is a method where a paste, in which a powder or sol of semiconductor particles is dispersed, is prepared, and the paste is applied onto an electron collector electrode substrate.

When the wet film forming method is used, the coating method is not particularly limited and coating can be performed according to any of methods known in the art. Coating can be performed according to various methods, such as dip coating, spraying, wire bar coating, spin coating, roller coating, blade coating, gravure coating, and a wet printing method (e.g., relief printing, offset printing, gravure printing, intaglio printing, rubber plate printing, and screen printing).

When the dispersion liquid of the semiconductor particles is formed by mechanical pulverization or using a mill, the dispersion liquid is formed by dispersing at least semiconductor particles alone, or a mixture including the semiconductor particles and a resin in water or an organic solvent. Examples of the resin for use include: a polymer or copolymer of a vinyl compound, such as styrene, vinyl acetate, acrylic acid ester, and methacrylic acid ester; a silicone resin; a phenoxy resin; a polysulfone resin; a polyvinyl butyral resin; a polyvinyl formal resin; a polyester resin; a cellulose ester resin; a cellulose ether resin; a urethane resin; a phenol resin; an epoxy resin; a polycarbonate resin; a polyacrylate resin; a polyamide resin; and a polyimide resin.

Examples of the solvent for dispersing the semiconductor particles include: water; alcohol-based solvents, such as methanol, ethanol, isopropyl alcohol, and α-terpineol; ketone-based solvents, such as acetone, methyl ethyl ketone, and methyl isobutyl ketone; ester-based solvents, such as ethyl formate, ethyl acetate, and n-butyl acetate; ether-based solvents, such as diethyl ether, dimethoxy ethane, tetrahydrofuran, dioxolane, and dioxane; amide-based solvents, such as N,N-dimethylformamide, N,N-dimethylacetamide, and N-methyl-2-pyrrolidone; halogenated hydrocarbon-based solvents, such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents, such as n-pentane, n-hexane, n-octane, 1,5-hexadiene, cyclohexane, methylcyclohexane, cyclohexadiene, benzene, toluene, o-xylene, m-xylene, p-xylene, ethyl benzene, and cumene. The above-listed examples may be used alone or in combination.

The dispersion liquid of the semiconductor particles, or the paste of the semiconductor particles obtained by a sol-gel method etc. may include acid (e.g., hydrochloric acid, nitric acid, and acetic acid), a surfactant (e.g., polyoxyethylene (10) octylphenyl ether), and a chelating agent (e.g., acetylacetone, 2-aminoethanol, and ethylenediamine) in order to prevent re-aggregation of the particles.

Moreover, it is also effective to add a thickening agent for the purpose of improving film formability. Examples of the thickening agent include: a polymer, such as polyethylene glycol, and polyvinyl alcohol; and ethyl cellulose.

After the semiconductor particles are applied, the particles are made electrically contact with one another, and firing, microwave irradiation, electron beam irradiation, or laser light irradiation is preferably performed for improving a film strength or adhesion to the substrate. The above-listed examples may be performed alone or in combination.

When the firing is performed, a range of a firing temperature is not particularly limited. When the temperature is too high, resistance of the substrate may be excessively high or the substrate may be melted. Therefore, the fixing temperature is preferably 30 degrees Celsius or higher but 700 degrees Celsius lower, and more preferably 100 degrees Celsius or higher but 600 degrees Celsius or lower. Moreover, the firing duration is not particularly limited, but the firing duration is preferably 10 minutes or longer but 10 hours or shorter.

For the microwave irradiation, microwaves may be applied from the side of the electron-transporting layer, or the back side. The irradiation duration is not particularly limited, but the microwave irradiation is preferably performed within 1 hour.

After the firing, chemical plating using a mixed solution of a titanium tetrachloride aqueous solution and an organic solvent, or electrochemical plating using a titanium tetrachloride aqueous solution may be performed increasing a surface area of the semiconductor particles, or increasing electron injection efficiency from the photosensitizing material to the semiconductor particles.

The film formed by laminating the semiconductor particles having diameters of several tens nanometers by firing forms a porous state. The nano-porous structure has an extremely high surface area, and the surface area can be represented by a roughness factor.

The roughness factor is a numerical value representing an actual area of an inner area of the pores relative to an area of the semiconductor particles applied to the substrate. Therefore, the larger roughness factor is more preferable. The roughness factor is correlated with the average thickness of the electron-transporting layer. In the present disclosure, the roughness factor is preferably 20 or greater.

The solar cell includes a sensitizing-dye electrode layer 5 for further improving conversion efficiency. The sensitizing-dye electrode layer 5 is a layer where a sensitizing dye (photosensitizing material) is adsorbed on a surface of the electron-transporting material 4 that is the electron-transporting layer.

—Sensitizing Dye (Photosensitizing Material)—

The photosensitizing material serving as the sensitizing dye is not limited as long as the photosensitizing material is a compound that is photoexcited by excitation light for use. Specific examples thereof include: metal complex compounds disclosed in Japanese Translation of PCT International Application Publication No. JPT-07-500630, Japanese Unexamined Patent Application Publication Nos. 10-233238, 2000-26487, 2000-323191, and 2001-59062; coumarin compounds disclosed in Japanese Unexamined Patent Application Publication Nos. 10-93118, 2002-164089, and 2004-95450, and J. Phys. Chem. C, 7224, Vol. 111 (2007); polyene compounds disclosed in Japanese Unexamined Patent Application Publication No. 2004-95450, and Chem. Commun., 4887 (2007); indoline compounds disclosed in Japanese Unexamined Patent Application Publication Nos. 2003-264010, 2004-63274, 2004-115636, 2004-200068, and 2004-235052, J. Am. Chem. Soc., 12218, Vol. 126 (2004), Chem. Commun., 3036(2003), and Angew. Chem. Int. Ed., 1923, Vol. 47 (2008); thiophene compounds disclosed in J. Am. Chem. Soc., 16701, Vol. 128 (2006), and J. Am. Chem. Soc., 14256, Vol. 128 (2006); cyanine dyes disclosed in Japanese Unexamined Patent Application Publication Nos. 11-86916, 11-214730, 2000-106224, 2001-76773, and 2003-7359; merocyanine dyes disclosed in Japanese Unexamined Patent Application Publication Nos. 11-214731, 11-238905, 2001-52766, 2001-76775, and 2003-7360; 9-arylxanthene compounds disclosed in Japanese Unexamined Patent Publication Nos. 10-92477, 11-273754, 11-273755, and 2003-31273; triarylmethane compounds disclosed in Japanese Unexamined Patent Application Publication Nos. 10-93118 and 2003-31273; and phthalocyanine compounds and coumarin compounds disclosed in Japanese Unexamined Patent Application Publication Nos. 09-199744, 10-233238, 11-204821, 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008). Among the above-listed examples, the metal complex compound, the coumarin compound, the polyene compound, the indoline compound, and the thiophene compound are particularly preferably used.

As the method for making the photosensitizing material 4' adsorbed on the electron-transporting material 4, a method where an electron collector electrode including semiconductor particles is immersed in a photosensitizing material solution or a dispersion liquid, or a method where a solution or dispersion liquid is applied to the electron-transporting layer to make the semiconductor particles adsorbed thereon may be used.

In the case of the former method, immersing, dip coating, roller coating, air knife coating, etc. may be used.

In the case of the latter method, wire bar coating, slide hopper coating, extrusion, curtain coating, spin coating, spray coating, etc. may be used.

Moreover, adsorption of the semiconductor particles may be performed in a supercritical fluid using carbon dioxide etc.

When the photosensitizing material is adsorbed, a condensing agent maybe used in combination.

The condensing agent may be an agent having a catalytic function to bind a photosensitizing material and an electron-transporting compound onto a surface of an inorganic material physically or chemically, or an agent that stoichiometrically functions to advantageously shift chemical equilibrium. Moreover, thiol or a hydroxyl compound may be added as a condensation aid.

Examples of the solvent for dissolving or dispersing the photosensitizing material include: water; alcohol-based solvents, such as methanol, ethanol, and isopropyl alcohol; ketone-based solvents, such as acetone, methyl ethyl ketone, and methyl isobutyl ketone; ester-based solvents, such as ethyl formate, ethyl acetate, and n-butyl acetate; ether-based solvents, such as diethyl ether, dimethoxy ethane, tetrahydrofuran, dioxolane, and dioxane; amide-based solvents, such as N,N-dimethylformamide, N,N-dimethylacetamide, and N-methyl-2-pyrrolidone; halogenated hydrocarbon-based solvents, such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents, such as n-pentane, n-hexane, n-octane, 1,5-hexadiene, cyclohexane, methylcyclohexane, cyclohexadiene, benzene, toluene, o-xylene, m-xylene, p-xylene, ethyl benzene, and cumene. The above-listed examples may be used alone or in combination.

Moreover, there is a photosensitizing material that more effectively functions when aggregation between molecules of a compound is suppressed depending on a type of the photosensitizing material. Therefore, a disaggregation agent may be used in combination.

The disaggregation agent is preferably a steroid compound (e.g., cholic acid, and chenodeoxycholic acid), long-chain alkyl carboxylic acid, or a long-chain alkyl phosphonic acid. The disaggregation agent is appropriately selected depending on the photosensitizing material for use.

An amount of the disaggregation agent is preferably 0.01 parts by mass or greater but 500 parts by mass or less, and more preferably 0.1 parts by mass or greater but 100 parts by mass or less relative to 1 part by mass of the photosensitizing material.

A temperature at which the photosensitizing material, or a combination of the photosensitizing material and the disaggregation agent is adsorbed is preferably −50 degrees Celsius or higher but 200 degrees Celsius or lower. Moreover, the adsorption may be performed with standing or stirring.

Examples of a method for the stirring include stirring using a stirrer, a ball mill, a paint conditioner, a sand mill, an attoritor, and a disperser, and ultrasonic dispersion, but the method is not limited to the above-listed examples. The time required for the adsorption is preferably 5 seconds or longer but 1,000 hours or shorter, more preferably 10 seconds or longer but 500 hours or shorter, and more preferably 1 minute or longer but 150 hours or shorter. Moreover, adsorption is preferably performed in the dark.

<Silicone-Containing Layer>

The silicone-containing layer of the solar cell and the production method thereof can be appropriately selected from the description of the silicone-containing layer of the electronic device of the present disclosure, and the production method thereof.

<Metal Oxide Film>

The metal oxide film 7 of the solar cell and the production method thereof can be appropriately selected from the description of the metal oxide film of the electronic device of the present disclosure, and the production method thereof.

<Second Electrode>

The second electrode is disposed after forming the metal oxide film.

Moreover, an electrode identical to the first electrode can be typically used as the second electrode. A support is not necessarily disposed in a structure where a strength and gas tightness are sufficiently maintained.

Specific examples of a material of the second electrode include: metal, such as platinum, gold, silver, copper, and aluminium; carbon-based compounds, such as graphite, fullerene, carbon nanotubes, and grapheme; conductive metal oxide, such as ITO, FTO, and ATO; and conductive polymers, such as polythiophene, and polyaniline.

The average thickness of the second electrode is not particularly limited. Moreover, the above-listed materials may be used alone or in combination.

The second electrode can be appropriately formed on the hole-transporting layer by a method, such as coating, laminating, vapor deposition, CVD, and bonding, depending on materials for use, or a type of the hole-transporting layer.

In order for the electronic device to function as a photoelectric conversion device (photoelectric conversion element), the first electrode or the second electrode, or the both are substantially transparent.

In the electronic device of the present disclosure, the side where the first electrode is disposed is transparent, and sunlight is preferably applied from the side of the first electrode. In this case, a material that reflects light is preferably used at the side of the second electrode, and the material is preferably glass or a plastic coated with metal or conductive oxide by vapor deposition, or a metal film.

Moreover, it is also effective to dispose an anti-reflection layer at the side from which sunlight is applied.

The photoelectric conversion element can be applied for a solar cell and a power supply including the solar cell. Application examples may be any of devices that have used a solar cell, or a power supply using the solar cell. For example, the photoelectric conversion element may be used for a solar cell of a desk-top electronic calculator or a watch. Examples utilizing properties of the photoelectric conversion element of the present disclosure include a power supply of a cell phone, electronic organizer, electronic paper, etc. Moreover, the photoelectric conversion element can be used as an auxiliary power supply for extending a continuous usage time of a charge-type or dry cell-type electrical appliance. Moreover, the photoelectric conversion element can be used as a primary cell alternative combined with a secondary cell, serving as a self-sufficient Power Supply for a Sensor.

<3: Organic Electroluminescent Element>

An embodiment of the electronic device of the present disclosure is an organic electroluminescent (EL) element.

FIG. 11 illustrates an organic EL element 10C that is an embodiment of the electronic device of the present disclosure.

In the present disclosure, a standard element structure is a reverse layer structure of an organic EL element that is advantages for durability of the element, but a structure of the organic EL element is not limited to the reverse layer structure.

The organic EL element has a laminate structure including a support 31, and a negative electrode 32, an electron-injecting layer 33, an electron-transporting layer 34, a light-emitting layer 35, a hole-transporting layer 36, a silicone-containing layer 37, a metal oxide film 38, and a positive electrode 39 disposed on the support in this order.

The details are described hereinafter.

<Support (Substrate)>

The support 31 is not particularly limited and may be selected from supports known in the art. A transparent material is preferably used as the substrate 1. Examples thereof include glass, transparent a plastic plate, a transparent plastic film, and a transparent inorganic crystal.

<Negative Electrode>

Examples of a material of the negative electrode include a single metal element, such as Li, Na, Mg, Ca, Sr, Al, Ag, In, Sn, Zn, and Zr, and alloys thereof. Moreover, LiF etc. may be formed as an electrode protective film on the negative electrode in the same manner as the formation of the negative electrode. In addition to the materials listed above, ITO, IZO, FTO, and aluminium are preferable. The average thickness of the negative electrode is preferably from 10 nm through 500 nm, and more preferably from 100 nm through 200 nm. The thickness thereof can be measured by spectroscopic ellipsometry, use of a surface roughness meter, or microscopic image analysis.

<Electron-Injecting Layer>

An electron-injecting layer 33 is disposed as a layer for reducing the obstacle for electron injection from the negative electrode into an electron-transporting layer formed of an organic material having small electron affinity. Examples of a material used for the electron-injecting layer include metal oxides including magnesium, aluminium, calcium, zirconium, silicon, titanium, or zinc, polyphenylene vinylene, hydroxyquinoline, and a naphthaylimide derivative.

The average thickness of the electron-injecting layer is preferably from 5 nm through 1,000 nm, and more preferably from 10 nm through 30 nm. The average thickness of the electron-injecting/transporting layer can be measured by spectroscopic ellipsometry, use of a surface roughness meter, or microscopic image analysis.

<Electron-Transporting Layer>

Examples of a low-molecular weight compound that can be used as a material of the electron-transporting layer include an oxazole derivative, an oxadiazole derivative, a pyridine derivative, a quinoline derivative, a pyrimidine derivative, a pyrazine derivative, a phenanthroline derivative, a triazine derivative, a triazole derivative, an imidazole derivative, tetracarboxylic acid anhydride, various metal complexes, such as tris(8-hydroxyquinolinato)aluminium ($Alq_3$), and a silole derivative. The above-listed examples may be used alone or in combination.

Among the above-listed examples, a metal complex, such as $Alq_3$, and a pyridine derivative are preferable.

The average thickness of the electron-transporting layer is preferably from 10 nm through 200 nm, and more preferably from 40 nm through 100 nm. The thickness thereof can be measured by spectroscopic ellipsometry, use of a surface roughness meter, or microscopic image analysis.

<Light-Emitting Layer>

Examples of a polymer material for forming the light-emitting layer 35 include a polyparaphenylene vinylene-based compound, a polyfluorene-based compound, and a polycarbazole-based compound.

Examples of the low-molecular weight material for forming the light-emitting layer include: metal complexes, such as tris(8-hydroxyquinolinato)aluminium ($Alq_3$), aluminium (III) tris(4-methyl-8-quinolate) ($Almq_3$), zinc 8-hydroxyquinoline ($Znq_2$), (1,10-phenanthroline)-tris-(4,4,4-trifluorotrifluoro-1-(2-thienyl)-butane-1,3-dionato)eur opium (III) (Eu$(TTA)_3$(phen)), a metal complex of platinum (II) 2,3,7,8,12,13,17,18-octaethyl-21H,23H-porphine, zinc (II) bis[2-(o-hydroxyphenylbenzothiazole] ($ZnBTZ_2$), bis[2-(2-hydroxyphenyl)-pyridine]beryllium ($Bepp_2$), and tris[3-methyl-2-phenylpyridine]iridium (III) ($Ir(mpy)_3$), a distyrylbenzene derivative, a phenanthrene derivative, a perylene-based compound, a carbazole-based compound, a benzimidazole-based compound, a benzothiazole-based compound, a coumarin-based compound, a perinone-based compound, an oxadiazole-based compound, a quinacridone-based compound, a pyridine-based compound, and a spiro compound. The above-listed examples may be used alone or in combination.

The average thickness of the light-emitting layer is not particularly limited. The average thickness thereof is preferably from 10 nm through 150 nm, and more preferably from 20 nm through 100 nm.

The film thickness can be measured by spectroscopic ellipsometry, a surface roughness meter, or microscopic image analysis.

<Hole-Transporting Layer>

Examples of a material used for the hole-transporting layer 36 of the organic EL element include an oxazole derivative, an oxadiazole derivative, an imidazole derivative, a triphenylamine derivative, a butadiene derivative, 9-(p-diethylaminostyrylanthracene), 1,1-bis-(4-dibenzylaminophenyl)propane, styryl anthracene, styryl pyrazoline, phenyl hydrazone, an a-phenylstilbene derivative, a thiazole derivative, a triazole derivative, a fenadine derivative, an acridine derivative, a benzofuran derivative, a benzimidazole derivative, and a thiophene derivative. Other examples thereof include polyaryl amine, a fluorene-arylamine copolymer, a fluorenebithiophene copolymer, poly(N-vinylcarbazole), polyvinylpyrene, polyvinyl anthracene, polythiophene, polyalkylthiophene, polyhexyl thiophene, poly(p-phenylenevinylene), poly(thinylene vinylene), a pyrene formaldehyderesin, an ethylcarbazole formaldehyde resin, and derivatives thereof. The above-listed hole-transporting materials may be used alone or in combination, or may be used as a mixture with other compounds.

The average thickness of the hole-transporting layer is preferably from 10 nm through 150 nm, and more preferably from 40 nm through 100 nm.

The above-listed hole-transporting materials may be used alone or in combination.

<Silicone-Containing Layer>

The silicone-containing layer 37 of the organic EL element and the production method thereof are appropriately selected from the description of the silicone-containing layer of the electronic device of the present disclosure and the production method thereof.

<Metal Oxide Film>

The metal oxide film 38 of the organic EL element and the production method thereof are appropriately selected from the description of the metal oxide film of the electronic device of the present disclosure and the production method thereof.

<Positive Electrode>

A material of the positive electrode 39 is preferably gold, silver, copper, aluminium, or ITO. The film thickness can be measured by spectroscopic ellipsometry, use of a surface roughness meter, or microscopic image analysis. In the case where the film is formed by vacuum vapor deposition, the film thickness can be measured by means of a quartz crystal oscillator film thickness tester.

EXAMPLES

Examples of the present disclosure will be described hereinafter. However, the present disclosure should not be construed as being limited to these Examples. In Examples below, "part(s)" denotes "part(s) by mass" unless otherwise stated.

Production Example 1

—Preparation of Copper Aluminium Oxide—

Copper aluminium oxide was prepared in the following manner. Cuprous oxide and alumina presented below were weight to be equal moles. The collected cuporous oxide and alumina were transferred to a mayonnaise bottle, and the mixture therein was stirred by means of a tubular mixer (Type T2C, available from Willy A. Bachofen AG Maschinenfabrik) to obtain a powder mixture. The obtained powder mixture was heated for 40 hours at 1,100 degrees Celsius and the resultant was passed through a sieve having a pore size of 100 micrometers.

(Powder Mixture Material)

Cuprous oxide (NC-803, available from NC TECH Co., Ltd.): 12 kg Alumina (AA-03, available from SUMITOMO CHEMICAL COMPANY, LIMITED): 8.58 kg The obtained copper aluminium oxide was pulverized by means of DRYSTAR SDA1 (available from Ashizawa Finetech Ltd.) to obtain a powder of copper aluminium oxide that had the particle sizes at 10% (D10), 50% (D50), and 90% (D90) in the cumulative number of 0.7±0.1 micrometers, 5.0±0.5 micrometers, 26±3 micrometers, respectively. The powder of copper aluminium oxide was vacuum dried at 100 degrees Celsius to adjust a moisture content of the copper aluminium oxide to 0.2% by mass or less.

The particle diameters of the copper aluminium oxide were values obtained by measuring by means of MICROTRAC MT3300 (MicrotracBEL Corp.) using a 0.2% sodium hexametaphosphate aqueous solution as a dispersion medium with a measurement duration of 10 seconds.

As for the moisture content measurement of the copper aluminium oxide, Karl Fischer moisture meter (CA-200, available from Mitsubishi Chemical Analytech Co., Ltd.) was used.

A composition ratio of the elements of the copper aluminium oxide was determined by an X-ray fluorescence spectrometer (ZSX PrimusIV, available from Rigaku Corporation), and the crystal structure was measured by means of an X-ray diffractometer (X'Pert PRO, available from Spectris Co., Ltd.).

Example 1

—Production Example of Electrophotographic Photoconductor—

Twenty electrophotographic photoconductors of Example 1 were each produced in the following manner. Each electrophotographic photoconductor of Example 1 included an intermediate layer, a charge-generating layer, a charge-transporting layer, a silicone-containing layer, and a metal oxide film disposed on a conductive support in this order.

—Formation of Intermediate Layer—

The following intermediate coating liquid was applied onto an aluminium conductive support (outer diameter: 100 mm, thickness: 1.5 mm) by dip coating, to form an intermediate layer. After drying for 30 minutes at 150 degrees Celsius, the average thickness of the intermediate layer was 5 micrometers.

(Intermediate Layer Coating Liquid)

Zinc oxide particles (MZ-300, available from TAYCA CORPORATION): 350 parts 3,5-Di-t-butylsalicylic acid (available from Tokyo Chemical Industry Co., Ltd.): 1.5 parts Blocked isocyanate (Sumidur (registered trademark) 3175, solid content: 75% by mass, available from Sumika Bayer Urethane Co., Ltd.): 60 parts Solution obtained by dissolving a butyral resin (20% by mass) in 2-butanone (BM-1, available from SEKISUI CHEMICAL CO., LTD.): 225 parts 2-Butanone: 365 parts —Formation of Charge-Generating Layer—

The following charge-generating layer coating liquid was applied onto the obtained intermediate layer by dip coating, to form a charge-generating layer. The average thickness of the charge-generating layer was 0.2 micrometers.

(Charge-Generating Layer Coating Liquid)

Y-type titanyl phthalocyanine: 6 parts

Butyral resin (S-LEC BX-1, available from SEKISUI CHEMICAL CO., LTD.): 4 parts

2-Butanone (available from KANTO CHEMICAL CO., INC.): 200 parts

—Formation of Charge-Transporting Layer—

The following charge-transporting layer coating liquid was applied onto the obtained charge-generating layer by dip coating to form a charge-transporting layer.

After drying for 20 minutes at 135 degrees Celsius, the average thickness of the charge-transporting layer was 22 micrometers.

(Charge-Transporting Layer Coating Liquid)

Bisphenol Z polycarbonate (PANLITE TS-2050, available from TEIJIN LIMITED): 10 parts Low molecular charge-transporting material having the following structural formula: 10 parts

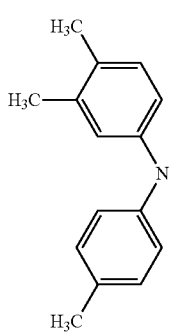
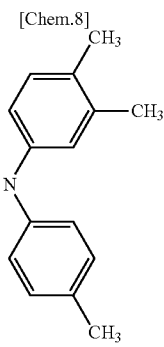

Tetrahydrofuran: 80 parts
—Formation of Silicone-Containing Layer—
The following silicone-containing layer coating liquid was applied onto the obtained charge-transporting layer by ring coating to form a silicone-containing layer. After drying for 20 minutes at 120 degrees Celsius, the average thickness of the silicone-containing layer was 0.5 micrometers.
(Silicone-Containing Layer Coating Liquid)
Silicone hardcoating liquid (NSC-5506, available from NIPPON FINE CHEMICAL CO., LTD.): 210 parts
Trimethylethoxysilane (available from Tokyo Chemical Industry Co., Ltd.): 27 parts
Charge-transporting material having the following structure (available from Ricoh Company, Limited): 10 parts Ethanol: 253 parts
—Formation of Metal Oxide Film—
As a film formation chamber, a chamber obtained by modifying a commercially available vapor deposition device was used.
A commercially available stirrer (T.K. AGI HOMO MIXER 2M-03, available from PRIMIX Corporation) was used for an aerosol generator. Note that, as the aerosol generator, a ultrasonic cleaner (SUS-103, available from Shimadzu Corporation), in which a commercially available pressure-feeding bottle (RBN-S, available from Kato Stainless Kagaku Co.) having a volume of 1 L is disposed, may be used.
A pipe having an inner diameter of 4 mm was drawn from the aerosol generator to the film formation chamber, and a jet nozzle (YB1/8MSSP37, available from Spraying Systems Co.) was attached at the edge of the pipe. A photoconductor was disposed at the position that was 50 mm apart from the jet nozzle. As a photoconductor holder, a mechanism that could rotate the photoconductor drum was disposed. As the jet nozzle, a jet nozzle that could laterally move was used. The aerosol generator and a gas cylinder filled with nitrogen were connected with a pipe having an inner diameter of 4 mm.

The targeted metal oxide film having the average thickness of 0.5 micrometers was produced in the following manner using the above-described device.

The aerosol generator was charged with a powder mixture including the copper aluminium oxide obtained in Production Example 1, and silica particles (Reolosil ZD30S, available from Tokuyama Corporation), which had been surface treated with dimethyl dichlorosilane and hexamethyldisilazane, had the BET surface area of $190\pm25$ $m^2/g$ and a carbon content of 2.9% by mass at the mass ratio of 99% (copper aluminium oxide): 1% (silica particles).

Next, vacuum drawing was performed from the film formation chamber to the aerosol generator by the exhaust pump. Then, nitrogen gas was sent from the gas cylinder into the aerosol generator, and stirring was initiated to generate an aerosol, in which particles were dispersed in nitrogen gas. The generated aerosol was ejected towards the photoconductor from the jet nozzle via the pipe. The flow rate of the nitrogen gas was from 13 L/min through 20 L/min. Moreover, the film formation duration was 20 minutes, and the degree of vacuum inside the film formation during formation of the metal oxide layer was from about 50 Pa through about 150 Pa. An amount of the silica particles included at the surface of the photoconductor (metal oxide film) after formation of the film was determined by an X-ray fluorescence spectrometer (ZSX PrimusIV, available from Rigaku Corporation). The silica particles were included in the photoconductor in the same amount as the charged amount.

Example 2

An electrophotographic photoconductor was produced in the same manner as in Example 1, except that the silicone-containing layer coating liquid was changed as follows.
(Silicone-Containing Layer Coating Liquid)
Silicone hardcoating liquid (NSC-5506, available from NIPPON FINE CHEMICAL CO., LTD.): 187 parts
Trimethylethoxysilane (available from Tokyo Chemical Industry Co., Ltd.): 24 parts
Charge-transporting material having the following structure (available from Ricoh Company, Limited): 20 parts

[Chem.10]

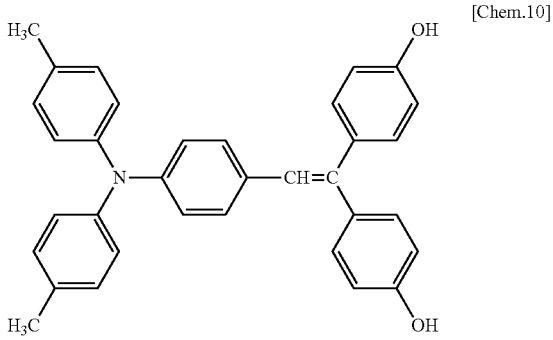 [SMILES: Cc1ccc(N(c2ccc(C)cc2)c2ccc(C=C(c3ccc(O)cc3)c3ccc(O)cc3)cc2)cc1]

Ethanol: 269 parts

Example 3

An electrophotographic photoconductor was produced in the same manner as in Example 1, except that the silicone-containing layer coating liquid was changed as follows.
(Silicone-Containing Layer Coating Liquid)
Silicone hardcoating liquid (NSC-5506, available from NIPPON FINE CHEMICAL CO., LTD.): 140 parts
Trimethylethoxysilane (available from Tokyo Chemical Industry Co., Ltd.): 18 parts
Charge-transporting material having the following structure (available from Ricoh Company, Limited): 40 parts

[Chem.11]

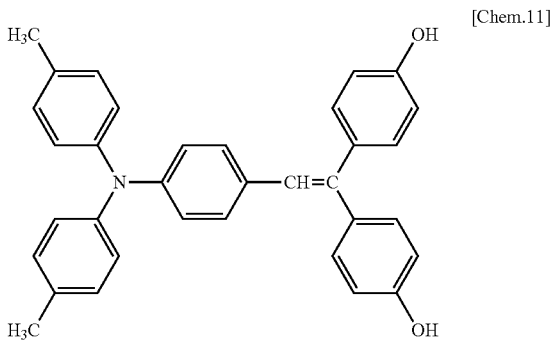 [SMILES: Cc1ccc(N(c2ccc(C)cc2)c2ccc(C=C(c3ccc(O)cc3)c3ccc(O)cc3)cc2)cc1]

Ethanol: 302 parts

Example 4

An electrophotographic photoconductor was produced in the same manner as in Example 1, except that the silicone-containing layer coating liquid was changed as follows.
(Silicone-Containing Layer Coating Liquid)
Silicone hardcoating liquid (NSC-5506, available from NIPPON FINE CHEMICAL CO., LTD.): 210 parts
Trimethylethoxysilane (available from Tokyo Chemical Industry Co., Ltd.): 27 parts Polysilane (OGSOL SI-10-10, available from Osaka Gas Chemicals Co., Ltd.): 10 parts
Tetrahydrofuran: 253 parts Example 5

An electrophotographic photoconductor was produced in the same manner as in Example 1, except that the silicone-containing layer coating liquid was changed as follows.
(Silicone-Containing Layer Coating Liquid)
Silicone hardcoating liquid (NSC-5506, available from NIPPON FINE CHEMICAL CO., LTD.): 187 parts
Trimethylethoxysilane (available from Tokyo Chemical Industry Co., Ltd.): 24 parts
Polysilane (available from OGSOL SI-10-10, Osaka Gas Chemicals Co., Ltd.): 20 parts
Tetrahydrofuran: 269 parts Example 6

An electrophotographic photoconductor was produced in the same manner as in Example 1, except that the silicone-containing layer coating liquid was changed as follows.
(Silicone-Containing Layer Coating Liquid)
Silicone hardcoating liquid (NSC-5506, available from NIPPON FINE CHEMICAL CO., LTD.): 140 parts
Trimethylethoxysilane (available from Tokyo Chemical Industry Co., Ltd.): 18 parts
Polysilane (available from OGSOL SI-10-10, Osaka Gas Chemicals Co., Ltd.): 40 parts
Tetrahydrofuran: 302 parts Example 7

An electrophotographic photoconductor was produced in the same manner as in Example 1, except that the silicone-containing layer coating liquid was changed as follows.
(Silicone-Containing Layer Coating Liquid)
Silicone hardcoating liquid (NSC-5506, available from NIPPON FINE CHEMICAL CO., LTD.): 187 parts
Trimethylethoxysilane (available from Tokyo Chemical Industry Co., Ltd.): 24 parts Charge-transporting material having the following structure (available from Ricoh Company, Limited): 20 parts

[Chem.12]

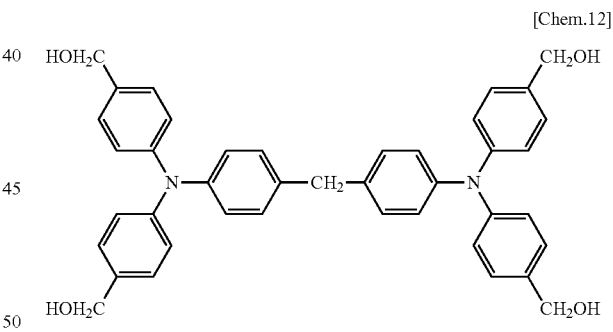

Acid catalyst (p-toluenesulfonic acid, available from Tokyo Chemical Industry Co., Ltd.): 0.008 parts
Tetrahydrofuran: 269 parts Production Example 2

The copper aluminium oxide produced in Production Example 1, which had not been ground, was ground by means of DRYSTAR SDA1 (available from Ashizawa Finetech Ltd.) to obtain a copper aluminium oxide powder having a cumulative particle size distribution 10% (D10) of 0.5±0.1 micrometers, a cumulative particle size distribution 50% (D50) of 1.6±0.2 micrometers, and a cumulative particle size distribution 90% (D90) of 7.2±0.7 micrometers.
A 50 mL glass sample bottle was charged with 100 g of YTZ balls each having a diameter of 2 mm, 0.18 g of wetting and dispersing additives (BYK-P105, available from BYK), 9.945 g of cyclopentanone, and 9 g of the ground copper aluminium oxide. The sample bottle was rotated at the speed of 150 rpm for 24 hours to perform a dispersing treatment of the copper aluminate. Subsequently, the dispersion liquid was passed through a stainless steel mesh having a mesh size of 400-mesh and 1,000-mesh to remove coarse particles. The solid content of the filtrate was adjusted to 30% by mass with ethanol. The resultant was provided as a metal oxide dispersion liquid.

Example 8

The following silicone-containing layer coating liquid was prepared using the metal oxide dispersion liquid obtained in Production Example 2.

An electrophotographic photoconductor was produced in the same manner as in Example 1, except that the silicone-containing layer coating liquid was replaced with the following silicone-containing layer coating liquid.
(Silicone-Containing Layer Coating Liquid)
Silicone hardcoating liquid (NSC-5506, available from NIPPON FINE CHEMICAL CO., LTD.): 210 parts
Trimethylethoxysilane (available from Tokyo Chemical Industry Co., Ltd.): 27 parts
Metal oxide dispersion liquid of Production Example 2: 33 parts
Ethanol: 230 parts Example 9

An electrophotographic photoconductor was produced in the same manner as in Example 8, except that the silicone-containing layer coating liquid was replaced with the following silicone-containing layer coating liquid.
(Silicone-Containing Layer Coating Liquid)
Silicone hardcoating liquid (NSC-5506, available from NIPPON FINE CHEMICAL CO., LTD.): 187 parts
Trimethylethoxysilane (available from Tokyo Chemical Industry Co., Ltd.): 24 parts
Metal oxide dispersion liquid of Production Example 2: 67 parts
Ethanol: 222 parts Example 10

An electrophotographic photoconductor was produced in the same manner as in Example 8, except that the silicone-containing layer coating liquid was replaced with the following silicone-containing layer coating liquid.
(Silicone-Containing Layer Coating Liquid)
Silicone hardcoating liquid (NSC-5506, available from NIPPON FINE CHEMICAL CO., LTD.): 140 parts
Trimethylethoxysilane (available from Tokyo Chemical Industry Co., Ltd.): 18 parts
Metal oxide dispersion liquid of Production Example 2: 133 parts
Ethanol: 309 parts Comparative Example 1

An electrophotographic photoconductor was produced in the same manner as in Example 1, except that the silicone-containing layer coating liquid was changed as follows.
(Silicone-Containing Layer Coating Liquid)
Silicone hardcoating liquid (NSC-5506, available from NIPPON FINE CHEMICAL CO., LTD.): 233 parts
Trimethylethoxysilane (available from Tokyo Chemical Industry Co., Ltd.): 30 parts
Ethanol: 237 parts <Removal of Silicone-Containing Layer and Metal Oxide Film>

The silicone-containing layer and the metal oxide film were removed in the following manner. Specifically, the photoconductor drum was mounted in the photoconductor reproduction device illustrated in FIG. 1, and the silicone-containing layer and the metal oxide film were removed under the removal conditions presented in Table 1 below. The completion of the removal of the silicone-containing layer or the metal oxide film could be judged by observing a discontinuous change point in the measurement value of torque of the photoconductor drum mounted in the device, and the change in the external appearance of the photoconductor drum.

If the removal is continued after observing a discontinuous change in the measurement value of torque, a film thickness of an underlying layer is reduced. In order to perform a reproducible test, it is desirable that the removal process be terminated within 30 seconds from observation of the discontinuous change.

<Conditions for Removing Silicone-Containing Layer and Metal Oxide Film>

TABLE 1

| Factor | Conditions |
| --- | --- |
| Rubber hardness of press roller | 60° |
| Runout tolerance of outer diameter of press roller | 30 μm |
| Surface roughness (Ra) of wrapping film | 2 μm |
| Abrasive grains of wrapping film | Alumina |
| Feeding speed of wrapping film | 2 m/hr |
| Rotational force for polishing (adjusted by load of press roller) | 3 ± 0.2 kgf/m |
| Termination conditions | Rotational force being 2.5 kg or less |
| Rotational speed of drum | 200 rpm |

<Evaluation of Electrophotographic Photoconductor>

To each of the electrophotographic photoconductors of Examples 1 to 10 and Comparative Example 1 produced in the above-described manner, which was a cylindrical photoconductor drum having a length of 380 mm, and an outer diameter of 100 mm, a gold electrode sticker including a silver wire having a diameter of 0.1 mm as a lead wire was adhered. The gold electrode sticker was adhered at the position that was 190 mm away from the edge of the drum along the predetermined circumferential direction as well as the longitudinal direction of the photoconductor drum. Moreover, a colorless transparent polyester tape (available from NITTO DENKO CORPORATION) having a thickness of 60 micrometers in the size large enough to sufficiently cover the gold electrode sticker was bonded thereon. The gold electrode sticker was obtained by depositing 25-nm gold electrode (electrode area: 50 $mm^2$) on a polyethylene film (polywrap, available from UBE FILM, LTD.) by vacuum vapor deposition. A carbon tape (available from Nisshin EM Co., Ltd.) was used to bond between the gold electrode and the lead wire.

The photoconductor drum obtained in the above-described manner was provided to a time-of-flight measuring device (TOF-401, available from Sumitomo Heavy Industries, Ltd.). A measurement environment was a dark room a temperature and humidity of which were maintained at 23 degrees Celsius and 55% RH.

A sub-nano dye laser KEC-160 attached to the device was used for irradiating the photoconductor drum with pulsed excitation light. As a laser dye of the light source, a DMSO solution (0.25 M) of DOTC (3,3'-Dimethyloxatricarbocyanine iodide, available from Optronscience, Inc.) was prepared. A quartz cell for the device filled with the DMSO solution was disposed in the middle of the light path of the nitrogen-gas pulsed laser light emitted from the device to change a wavelength of the pulsed laser light. In the time-of-flight measurement, pulsed laser light having a wavelength of 782 nm was used. The exposure area of the photoconductor surface was 0.5 mm in diameter.

Bias (+500 V) was applied to the aluminium support of the photoconductor drum to emit pulsed laser light having the 782 nm from the surface thereof on which the electrode sticker was disposed, and the transport state of charge carriers, which were photo-excited in the charge-generating layer of the photoconductor, was plotted and observed as a waveform representing a change of photocurrents over time, using an oscilloscope. An example of the measurement result is presented in FIG. 12.

In the present disclosure, an area defined by the waveform and the horizontal axis of FIG. 12 is determined as a quantity of electric charge. The quantity of electric charge of the measurement sample whose surface was silicone-containing layer was expressed as Q(ACL), and the quantity of electric charge of the measurement sample from which the silicone-containing layer had been removed was expressed as Q(CTL). The range for calculating the area was set to an area from 0 seconds to a point where the transient photocurrent attenuated with respect to the measurement time and no change was observed in the transient photocurrent other than noises.

In order to compare the quantity of electric charge between the samples, all of the measurement conditions of the transient photocurrent were fixed. Specifically, the load resistance RL of the time-of-flight measuring device was fixed to 1 kiloohm, the gain of the signal was fixed to 50 times, the ND filter with which pulsed laser light was passed through was fixed to 10%, and the number of the integration of the transient photocurrent measurements was fixed to 32 times. Since there was no significant change in the transient photocurrent waveforms from the 32 measurements, it was assumed that irradiance of the pulsed laser light was substantially constant.

<Ratio of Quantity of Electric Charge>

Once the metal oxide film was removed using the device of FIG. 1, the silicone-containing layer was exposed. A quantity of electric charge Q(ACL) was calculated from a measurement of a transient photocurrent waveform of the electronic device where the silicone-containing layer was exposed at the surface. A sum of the photocurrent values obtained by a time-of-flight measuring device (TOF-401), each multiplied by a sampling time, was determined as a quantity of electric charge Q(ACL). In the present disclosure, a photocurrent value was sampled per 0.1 microseconds.

Next, the silicone-containing layer was similarly removed by means of the device of FIG. 1. A quantity of electric charge Q(CTL) was calculated by a measurement of a transient photocurrent waveform of the electronic device of this state in the same manner as described above.

A ratio of the quantity of electric charge was determined from the quantity of electric charge Q(ACL) and the quantity of electric charge Q(CTL) according to the following equation.

[Math. 2]

$$\text{Ratio of electric charge quantity} = \frac{Q(ACL)}{Q(CTL)} \quad \text{Equation (1)}$$

<Evaluation of Halftone Image Print>

Each of the photoconductors obtained in Examples and Comparative Examples was assembled to be mounted, and a halftone image was printed by means of Ricoh Pro C9110 (available from Ricoh Company, Limited). As the halftone image, printed was an image pattern where white and black were alternately arranged per 2 pixels in longitudinal and transverse direction at image resolution of 600 dpi. As a printing sheet, Copy Paper in A3 size (POD Gloss Coat, available from Oji Paper Co., Ltd.), and Protoner Black C9100 was used as a toner.

The most uniform region on the printing sheet, on which the halftone image had been printed, was selected based on the visual observation, and a magnified photographic image (tif file format) of the selected region in the size of a 4 mm-square was taken by a microscope (MXMACROZVI, available from HIROX CO., LTD.).

The area of all of the dots in the obtained image excluding the edge of the image was determined using image analysis software (image J, available from The National Institute of Health, U.S.A.), and the result was evaluated based on the value of the coefficient of variation (the value obtained by dividing the standard deviation by the average).

(Image Ranks)

Rank 5: The coefficient of variation was less than 0.2.

Rank 4: The coefficient of variation was 0.2 or greater but less than 0.3.

Rank 3: The coefficient of variation was 0.3 or greater but less than 0.4.

Rank 2: The coefficient of variation was 0.4 or greater but less than 0.5.

Rank 1: The coefficient of variation was 0.5 or greater, or dots could not be developed.

The evaluation results of the ratio of electric charge quantity and halftone image print of the electronic devices of Examples 1 to 10 and Comparative Example 1 are presented in Table 2.

TABLE 2

| | Ratio of quantity of electric charge [%] | Evaluation of halftone image print [rank] |
|---|---|---|
| Ex. 1 | 12 | 4 |
| Ex. 2 | 15 | 5 |
| Ex. 3 | 20 | 5 |
| Ex. 4 | 13 | 4 |
| Ex. 5 | 12 | 4 |
| Ex. 6 | 12 | 4 |
| Ex. 7 | 16 | 5 |
| Ex. 8 | 10 | 3 |
| Ex. 9 | 13 | 4 |
| Ex. 10 | 15 | 5 |
| Comp. Ex. 1 | 2 | 1 |

Conventionally, there was no problem in light attenuation characteristics or chargeability of a photoconductor when a silicone hardcoating material of Comparative Example 1 was used. In the case where such a photoconductor was used as a photoconductor for producing a highly precise image, however, it was made clear in the present disclosure that a large quantity of electric charge was needed as the quantity of electric charge contributing to charge transport.

The photoconductors of Examples 1 to 10, whose ratio of the quantity of electric charge was 10% or greater enabled precise photoelectric conversion, and could develop a halftone image having no problem on practical use. In order to increase the ratio of the quantity of electric charge to 10% or greater, it is effective to add a p-type semiconductor material to the silicone-containing layer. For example, the metal oxide particles of the triphenylamine derivative or delafossite used in Examples 1 to 10 are effective.

For example, embodiments of the present disclosure are as follows.

<1> An electronic device including:
a support;
a charge-transporting layer including a charge-transporting material or a dye-sensitizing electrode layer including a sensitizing dye, where the charge-transporting layer or the sensitizing-dye electrode layer is disposed on or above the support;
a silicone-containing layer disposed on or above the charge-transporting layer or the sensitizing-dye electrode layer; and
a metal oxide film disposed on or above the silicone-containing layer,
wherein a ratio [Q(ACL)/Q(CTL)] is 10% or greater, where Q(ACL) is a time integral of a transient photocurrent waveform of an electronic device (ACL) measured by a time-of-flight method, and Q(CTL) is a time integral of a transient photocurrent waveform of an electronic device (CTL) measured by a time-of-flight method,
wherein the electronic device (ACL) has the silicone-containing layer as an outermost layer, and is obtained by removing the metal oxide film from the electronic device, and
wherein the electronic device (CTL) has the charge-transporting layer or the sensitizing-dye electrode layer as an outermost layer, and is obtained by removing the metal oxide film and the silicone-containing layer from the electronic device.

<2> The electronic device according to <1>,
wherein the silicone-containing layer includes, as a constitutional component, at least one selected from the group consisting of a triphenylamine compound having a hydroxyl group, polymethylphenylsilane, and delafossite oxide.

<3> The electronic device according to <2>,
wherein a combined amount of the triphenylamine compound and the delafossite oxide is 10% by mass or greater but 40% by mass or less relative to a total amount of all of constitutional components of the silicone-containing layer.

<4> The electronic device according to any one of <1> to <3>,
wherein the silicone-containing layer includes monoalkoxysilane as a constitutional component.

<5> The electronic device according to any one of <1> to <4>,
wherein the metal oxide film includes delafossite oxide.

<6> The electronic device according to <5>,
wherein the delafossite oxide is copper aluminium oxide.

<7> The electronic device according to any one of <1> to <6>,
wherein the metal oxide film includes silica.

<8> A method for producing an electronic device, the method including spraying raw materials of a metal oxide film onto a silicone-containing layer to form the metal oxide film,
wherein the electronic device is the electronic device according to any one of <1> to <7>, and the metal oxide film and the silicone-containing layer are the metal oxide film and the silicone-containing layer of the electronic device.

<9> The method according to <8>,
wherein the spraying is spraying particles of the raw materials of the metal oxide film onto the silicone-containing layer through aerosol deposition.

<10> An image forming method including
forming an image using the electronic device according to any one of <1> to <7>.

<11> An image forming apparatus including
the electronic device according to any one of <1> to <7>.

The electronic device according to any one of <1> to <7>, the method for producing an electronic device according to <8> or <9>, the image forming method according to <10>, and the image forming apparatus according to <11> can solve the above-described various problems existing in the art and can solve the object of the present disclosure.

REFERENCE SIGNS LIST

1A: charge eliminating device
1B: pre-cleaning exposing device
1C: driving unit
1D: first transferring device
1E: second transferring device
1F: intermediate transfer belt
1G: conveying transfer belt
3A: lubricant
3B: coating brush
3C: coating blade
3D: press spring
10A: electrophotographic photoconductor
10B: electronic device
10C: organic EL element
11, 11Y, 11M, 11C, 11Bk: electrophotographic photoconductor
12, 12Y, 12M, 12C, 12Bk: charging device
13, 13Y, 13M, 13C, 13Bk: exposing device
14, 14Y, 14M, 14C, 14Bk: developing device
16, 16Y, 16M, 16C, 16Bk: transferring device
17, 17Y, 17M, 17C, 17Bk: cleaning device
18: printing medium
19: fixing device
231: photoconductor
232: wrapping film
233: press roller
234: load member
235: pinch roller
236: feed roller
237: load member
238: feed roller
239: feeding roller
240: winding roller
241: photoconductor torquemeter

The invention claimed is:
1. An electronic device, comprising:
a support;
a charge-transporting layer including a charge-transporting material or a dye-sensitizing electrode layer including a sensitizing dye, where the charge-transporting layer or the sensitizing-dye electrode layer is disposed on or above the support;

a silicone-containing layer disposed on or above the charge-transporting layer or the sensitizing-dye electrode layer; and a metal oxide film disposed on or above the silicone-containing layer, wherein a ratio [Q(ACL)/Q (CTL)] is 10% or greater, where Q(ACL) is a time integral of a transient photocurrent waveform of an electronic device (ACL) measured by a time-of-flight method, and Q(CTL) is a time integral of a transient photocurrent waveform of an electronic device (CTL) measured by a time-of-flight method, wherein the electronic device (ACL) has the silicone-containing layer as an outermost layer, and is obtained by removing the metal oxide film from the electronic device, wherein the electronic device (CTL) has the charge-transporting layer or the sensitizing-dye electrode layer as an outermost layer, and is obtained by removing the metal oxide film and the silicone-containing layer from the electronic device; and wherein the silicone-containing layer includes, as a constitutional component, at least one selected from the group consisting of a triphenylamine compound having a hydroxyl group, polymethylphenylsilane, and delafossite oxide.

2. The electronic device according to claim 1, wherein a combined amount of the triphenylamine compound and the delafossite oxide is 10% by mass or greater but 40% by mass or less relative to a total amount of all of constitutional components of the silicone-containing layer.

3. The electronic device according to claim 1, wherein the silicone-containing layer includes monoalkoxysilane as a constitutional component.

4. The electronic device according to claim 1, wherein the metal oxide film includes delafossite oxide.

5. The electronic device according to claim 4, wherein the delafossite oxide is copper aluminium oxide.

6. The electronic device according to claim 1, wherein the metal oxide film includes silica.

7. A method for producing an electronic device, the method comprising:

spraying raw materials of a metal oxide film onto a silicone-containing layer to form the metal oxide film, wherein the electronic device is the electronic device according to claim 1, and the metal oxide film and the silicone-containing layer are the metal oxide film and the silicone-containing layer of the electronic device.

8. The method according to claim 7, wherein the spraying is spraying particles of the raw materials of the metal oxide film onto the silicone-containing layer through aerosol deposition.

9. An image forming method, comprising:

forming an image using the electronic device according to claim 1.

10. An image forming apparatus, comprising:

the electronic device according to claim 1.

* * * * *